(12) United States Patent
Muroyama et al.

(10) Patent No.: US 10,892,302 B2
(45) Date of Patent: Jan. 12, 2021

(54) PHOTOELECTRIC CONVERSION ELEMENT, IMAGING ELEMENT, STACKED-TYPE IMAGING ELEMENT, AND SOLID-STATE IMAGING APPARATUS

(71) Applicant: SONY CORPORATION, Tokyo (JP)

(72) Inventors: Masakazu Muroyama, Kanagawa (JP); Masashi Bando, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 0 days.

(21) Appl. No.: 16/462,788

(22) PCT Filed: Oct. 10, 2017

(86) PCT No.: PCT/JP2017/036640
§ 371 (c)(1),
(2) Date: May 21, 2019

(87) PCT Pub. No.: WO2018/110050
PCT Pub. Date: Jun. 21, 2018

(65) Prior Publication Data
US 2019/0371862 A1 Dec. 5, 2019

(30) Foreign Application Priority Data
Dec. 16, 2016 (JP) ................. 2016-244223

(51) Int. Cl.
*H01L 27/30* (2006.01)
*H01L 51/00* (2006.01)
*H04N 5/361* (2011.01)

(52) U.S. Cl.
CPC ........ *H01L 27/307* (2013.01); *H01L 51/0034* (2013.01); *H01L 51/0047* (2013.01); *H01L 51/0059* (2013.01); *H04N 5/361* (2013.01)

(58) Field of Classification Search
CPC ............... H01L 27/307; H01L 51/0034; H01L 51/0047; H01L 51/0059; H04N 5/361
See application file for complete search history.

(56) References Cited

U.S. PATENT DOCUMENTS

| 2006/0057480 A1* | 3/2006 | Lin ...................... G03G 5/142 430/65 |
| 2009/0223566 A1 | 9/2009 | Mitsui et al. |
| 2011/0197966 A1* | 8/2011 | Nojima ................. H01L 51/441 136/256 |

(Continued)

FOREIGN PATENT DOCUMENTS

| CN | 102456838 A | 5/2012 |
| EP | 2448031 A2 | 5/2012 |

(Continued)

OTHER PUBLICATIONS

International Search Report and Written Opinion of PCT Application No. PCT/JP2017/036640, dated Nov. 14, 2017, 12 pages of ISRWO.

*Primary Examiner* — Peniel M Gumedzoe
(74) *Attorney, Agent, or Firm* — Chip Law Group

(57) ABSTRACT

There is provided an imaging element that has a stacked structure of a first electrode, an organic photoelectric conversion layer, and a second electrode. A first organic material layer and a second organic material layer are formed between the first electrode and the organic photoelectric conversion layer from the first electrode side.

15 Claims, 15 Drawing Sheets

(56) References Cited

U.S. PATENT DOCUMENTS

2012/0098079 A1  4/2012 Suzuki
2013/0069047 A1  3/2013 Mitsui et al.
2017/0044308 A1* 2/2017 Funyuu ................ C09D 11/102

FOREIGN PATENT DOCUMENTS

| JP | 2007-088033 A | 4/2007 |
| JP | 2010-103457 A | 5/2010 |
| JP | 2011-097079 A | 5/2011 |
| JP | 2011-119745 A | 6/2011 |
| JP | 2012-094660 A | 5/2012 |
| JP | 2014-022525 A | 2/2014 |
| JP | 2015-149483 A | 8/2015 |
| JP | 2016-063084 A | 4/2016 |
| KR | 10-2012-0043659 A | 5/2012 |
| WO | 2011/148717 A1 | 12/2011 |
| WO | 2016/042939 A1 | 3/2016 |
| WO | 2016/185858 A1 | 11/2016 |

\* cited by examiner

PHOTOELECTRIC CONVERSION ELEMENT, IMAGING ELEMENT, STACKED-TYPE IMAGING ELEMENT, AND SOLID-STATE IMAGING APPARATUS

CROSS REFERENCE TO RELATED APPLICATIONS

This application is a U.S. National Phase of International Patent Application No. PCT/JP2017/036640 filed on Oct. 10, 2017, which claims priority benefit of Japanese Patent Application No. JP 2016-244223 filed in the Japan Patent Office on Dec. 16, 2016. Each of the above-referenced applications is hereby incorporated herein by reference in its entirety.

TECHNICAL FIELD

The present disclosure relates to a photoelectric conversion element, an imaging element, a stacked-type imaging element, and a solid-state imaging apparatus.

BACKGROUND ART

Imaging elements using organic materials (organic photodiode) can photoelectrically convert specific colors (wavelength bands) only. In this case, the imaging elements have characteristics. Consequently, in a case in which the imaging elements are used in solid-state imaging apparatuses, subpixels are formed by combinations of on-chip color filters (OCCFs) and the imaging elements and structures in which the subpixels are stacked (stacked-type imaging elements) and which are not realized in solid-state imaging elements of the related art in which subpixels are arrayed 2-dimensionally can be obtained. Thus, since incident light can be received with high efficiency, high sensitivity of the solid-state imaging apparatuses is expected. In addition, since demosaic processes are not necessary, there is an advantage that false color is not generated.

An imaging element (a photoelectric conversion element) having an organic electron blocking layer is known from, for example, the publication of JP 2007-088033A. In the photoelectric conversion element disclosed in the Patent Literature, an organic photoelectric conversion layer is disposed between a pair of electrodes, and an organic electron blocking layer is disposed between one of the electrodes and the organic photoelectric conversion layer.

CITATION LIST

Patent Literature

Patent Literature 1: JP 2007-088033A

DISCLOSURE OF INVENTION

Technical Problem

Since the organic electron blocking layer is disposed in the imaging element disclosed in the above-described Patent Literature, there is a possibility that the occurrence of a dark current can be reduced in an early stage. However, the dark current has a high value and characteristics of the imaging element are unsatisfactory. Moreover, there is a problem in that the value of the dark current increases over time.

Therefore, an objective of the present disclosure is to provide an imaging element (including a stacked-type imaging element) and a photoelectric conversion element having a low dark current value showing little change over time, and a solid-state imaging apparatus including the imaging element.

Solution to Problem

An imaging element according to the present disclosure or a photoelectric conversion element according to the present disclosure to achieve the object described above has a stacked structure of a first electrode, an organic photoelectric conversion layer, and a second electrode. A first organic material layer and a second organic material layer are formed between the first electrode and the organic photoelectric conversion layer from the first electrode side.

A stacked-type imaging element according to the present disclosure to achieve the object described above is formed by stacking at least one imaging element according to the present disclosure.

The solid-state imaging apparatus according to the first aspect of the present disclosure for achieving the foregoing object includes a plurality of the imaging elements of the present disclosure. In addition, the solid-state imaging apparatus according to the second aspect of the present disclosure for achieving the foregoing object includes a plurality of the stacked-type imaging elements of the present disclosure.

Advantageous Effects of Invention

In the imaging element or the photoelectric conversion element of the present disclosure, the first organic material layer and the second organic material layer are formed between the first electrode and the organic photoelectric conversion layer from the first electrode side. Here, undesired injection of charge from the organic photoelectric conversion layer to the first electrode can be prevented by the first organic material layer, and as a result, a low dark current value can be achieved. Moreover, since the second organic material layer is formed between the first organic material layer and the organic photoelectric conversion layer, stability of the first organic material layer or the organic photoelectric conversion layer can be improved, and as a result, an imaging element or a photoelectric conversion element with little change in the dark current value over time can be obtained. In addition, the effects described in the present specification are merely examples and are not limitative, and additional effects may be exhibited.

MODE(S) FOR CARRYING OUT THE INVENTION

Figure 1A:
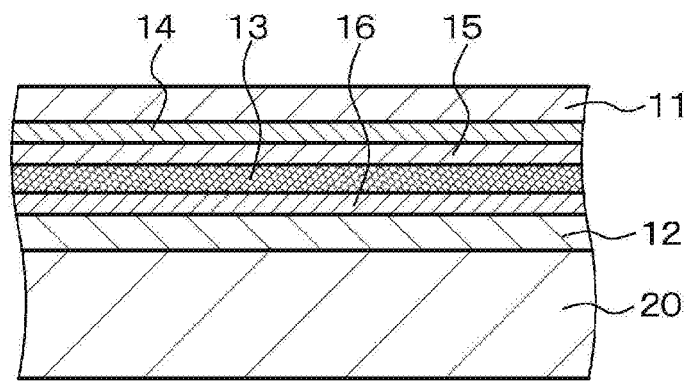
FIG. 1A and FIG. 1B are conceptual diagrams illustrating sectional views of an imaging element or a photoelectric conversion element of Embodiment 1.

Hereinafter, the present disclosure will be described with reference to the drawings according to embodiments. However, the present disclosure is not limited to the embodiments and various numerical values or materials in the embodiments are exemplary. Further, the description will be made in the following order.
1. General description of photoelectric conversion element of present disclosure, imaging element of present disclosure, stacked-type imaging element of present disclosure, and solid-state imaging apparatus according to first aspect and second aspect of present disclosure
2. Embodiment 1 (imaging element and photoelectric conversion element of present disclosure)
3. Embodiment 2 (modification of Embodiment 1)
4. Embodiment 4 (imaging element and photoelectric conversion element of present disclosure, and solid-state imaging apparatus according to second aspect of present disclosure)
5. Embodiment 5 (modification of Embodiment 3)
6. Embodiment 3 (modification of Embodiment 3, and solid-state imaging apparatus according to first aspect of present disclosure)
7. Others
<General Description of Photoelectric Conversion Element of Present Disclosure, Imaging Element of Present Disclosure, Stacked-Type Imaging Element of Present Disclosure, and Solid-State Imaging Apparatus According to First to Second Aspects of Present Disclosure>

In an imaging element or a photoelectric conversion element of the present disclosure, or an imaging element forming a stacked-type imaging element of the present disclosure or a solid-state imaging apparatus according to first to second aspects of the present disclosure (which will be collectively referred to as an "imaging element or the like of the present disclosure" below), a first organic material layer may specifically function as a charge injection blocking layer, and in this case, the first organic material layer may more specifically function as a hole injection blocking layer. In addition, in the imaging element or the like according to an embodiment of the present disclosure including various preferred modes described above, the first organic material layer may be formed of a material having a naphthalene diimide (NDI) structure (or a naphthalene-1,4,5,8-tetracarboxylic acid diimide structure). Furthermore, in the imaging element or the like according to an embodiment of the present disclosure including various preferred modes described above, a LUMO value of a material forming the first organic material layer may be deeper than −3.9 eV, and a HOMO value thereof may be deeper than −6.2 eV. By defining the LUMO value and the HOMO value of the material forming the first organic material layer as described above, undesired injection of charge (specifically, injection of holes) from an organic photoelectric conversion layer to a first electrode can be suppressed and a low dark current value can be achieved.

Furthermore, in the imaging element or the like according to an embodiment of the present disclosure including various preferred modes described above, a second organic material layer may function as a base layer, may function as a cohesion suppressing layer, or may function as a diffusion preventing layer. Furthermore, in the imaging element or the like according to an embodiment of the present disclosure including various preferred modes described above, the second organic material layer may be formed of a material having a pyridine end. The material having a pyridine end can exhibit a strong interaction between molecules due to hydrogen bonding formed by the pyridine end and form a strong film structure. Thus, degeneration of the first organic material layer and the second organic material layer which is likely to lead to deterioration in dark current characteristics can be prevented. Furthermore, in the imaging element or the like according to an embodiment of the present disclosure including various preferred modes described above, it is desirable for a material forming the second organic material layer to have a glass transition temperature of 160° C. or higher. By using a material having the glass transition temperature of 160° C. or higher as described above, sufficient heat resistance against the processing temperature at the time of manufacturing of the imaging element and the like can be secured. Furthermore, in the imaging element or the like according to an embodiment of the present disclosure including various preferred modes described above, a thickness of the second organic material layer may be $1 \times 10^{-9}$ m to $5 \times 10^{-8}$ m, and preferably $2 \times 10^{-9}$ m to $3 \times 10^{-8}$ m. By causing the second organic material layer to have such a thickness, it is possible to effectively prevent a dark current that occurs due to undesired injection of charges from the organic photoelectric conversion layer to the first electrode, and at the same time to efficiently transport carriers generated in the organic photoelectric conversion layer, and to maintain high photoelectric conversion efficiency.

Furthermore, in the imaging element or the like according to an embodiment of the present disclosure including various preferred modes described above, the organic photoelectric conversion layer may be formed of a material having a bulk heterostructure including a hole transport material and an electron transport material, that is, may be formed of a bulk heterolayer including a hole transport material and an electron transport material. It is desirable for the organic photoelectric conversion layer to further include an organic semiconductor material having a large ray extinction coefficient (also referred to as an "optical absorption organic semiconductor material" for the sake of convenience). However, a configuration of the organic photoelectric conversion layer is not limited thereto, and it may be formed of a p-type organic material or an n-type organic material. Organic semiconductors are mostly classified into the p-type and the n-type, and the p-type means that holes are easily transported and the n-type means that electrons are easily transported. The interpretation of organic semiconductors is not limited to having holes or electrons as thermally excited majority carriers like inorganic semiconductors.

Here, it is desirable for a value of a ray absorption coefficient $\mu_3$ of an optical absorption organic semiconductor material at the maximum light absorption wavelength in the visible light range to be greater than a value of a ray absorption coefficient $\mu_1$ of a hole transport material at the maximum light absorption wavelength in the visible light range and greater than a value of a ray absorption coefficient $\mu_2$ of an electron transport material at the maximum light absorption wavelength in the visible light range. For this reason, light (photons) incident on an organic photoelectric conversion layer can be selectively absorbed by the optical absorption organic semiconductor material having a high ray extinction coefficient. The photons absorbed by the optical absorption organic semiconductor material turn into excitons, then cause exciton separation on the interface between the hole transport material and the optical absorption organic semiconductor material, the interface between the electron transport material and the optical absorption organic semiconductor material, or the interfaces of the hole transport material with the electron transport material and the optical absorption organic semiconductor material, and thereby can generate hole and electron carriers. The generated carriers (holes and electrons) are transmitted to electrodes with high efficiency on the basis of high hole mobility of the hole transport material and high electron mobility of the electron transport material. Then, the holes and electrons that have reached the electrodes are each sensed as photocurrents. The probability of a photocurrent occurring with respect to incident photons is generally called photoelectric conversion efficiency. Thus, by defining values of ray absorption coefficients $\mu_1$, $\mu_2$, and $\mu_3$, the optical absorption organic semiconductor material can selectively and effectively absorb light, and in accordance with the principle, high photoelectric conversion efficiency can be achieved. A ray absorption coefficient can be calculated on the basis of a method of obtaining an absorption rate (%) of photons of a thin film of an organic semiconductor material at a wavelength using a UV-visible spectrophotometer and obtaining a film thickness using a stylus-based roughness meter or the like. An exciton-charge separation rate at which excitons are subject to exciton separation is preferably $1 \times 10^{10}$ s$^{-1}$ or higher. Furthermore, in the above configurations, the organic photoelectric conversion layer may have a maximum light absorption wavelength in the range of 450 nm to 650 nm.

The optical absorption organic semiconductor material may be composed of a subphthalocyanine derivative including subphthalocyanine expressed by the following structural formula (10). Here, as the subphthalocyanine derivative, the following structural formula (11) can be exemplified, and more specifically, the following structural formula (12) abbreviated as "SubPc-Cl," the following structural formula (13) abbreviated as "SubPc-F," the following structural formula (14) abbreviated as "SubPc-OC6F5," the following structural formula (15) abbreviated as "F12SubPc-Cl," the following structural formula (16) abbreviated as "F6SubPc-Cl," the following structural formula (17) abbreviated as "F6SubPc-F," and the following structural formula (18) abbreviated as "F6SubPc-OC6F5" can be exemplified. Since the subphthalocyanine derivative has a high ray extinction coefficient, the optical absorption organic semiconductor material can be caused to absorb light more selectively and generate excitons by using the subphthalocyanine derivative.

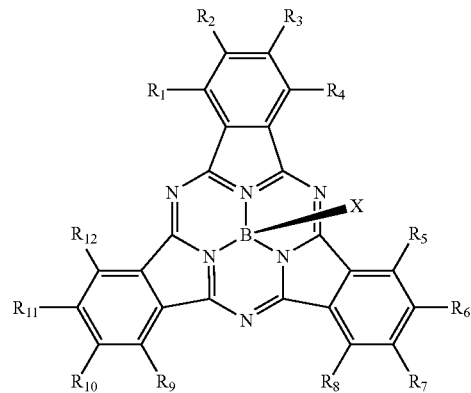

(10)

Here, X and R1 to R12 are each independently at least one type of group selected from a group composed of a hydrogen atom; and a halogen atom including chlorine and fluorine; or a linear, branched or cyclic alkyl group or phenyl group; a linear or condensed aromatic ring; a partial fluoroalkyl group; a perfluoroalkyl group; a silylalkyl group; a silylalkoxy group; an arylsilyl group; a thioalkyl group; a thioaryl group; an arylsulfonyl group; an alkylsulfonyl group; an amino group; an alkylamino group; an arylamino group; a hydroxy group; an alkoxy group; an acylamino group; an acyloxy group; a phenyl group; a carboxy group, a carboxamide group, a carboalkoxy group, an acyl group; a sulfonyl group; a cyano group; and a nitro group. A bivalent or trivalent metal may also be used instead of B (boron).

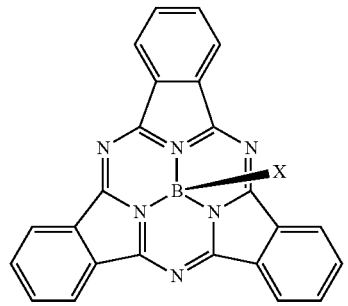

(11)

<SubPc-Cl>

(12)

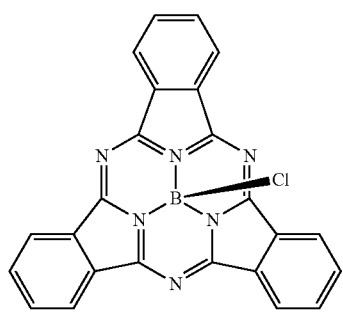

<SubPc-F>

(13)

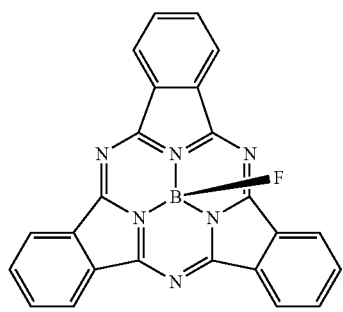

<SubPc-OC6F5>

(14)

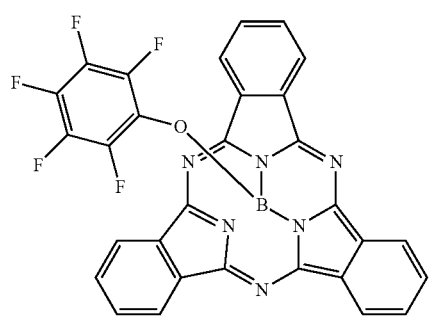

<F12SubPc-Cl>

(15)

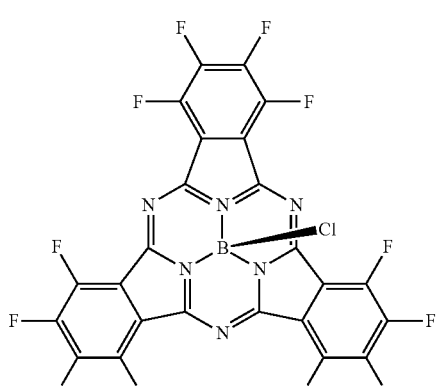

<F6SubPc-Cl>

(16)

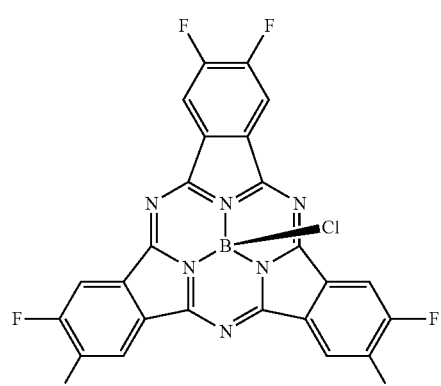

<F6SubPc-F>

(17)

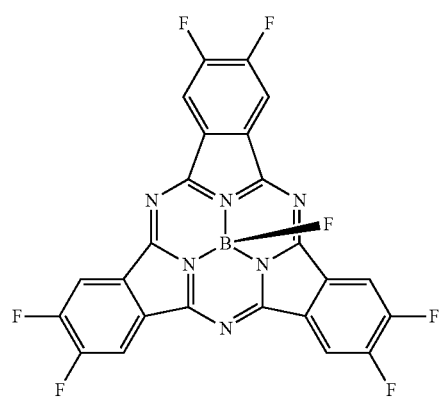

<F6SubPc-OC6F5>

(18)

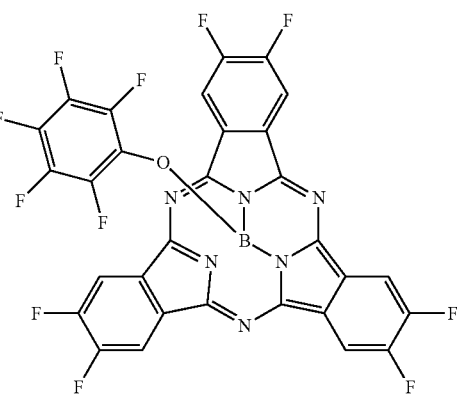

Examples of electron transport materials include, for example, fullerenes (higher fullerene) such as $C_{60}$, $C_{70}$, $C_{74}$ fullerenes or the like, endohedral fullerene or the like, fullerene derivatives (e.g., fullerene fluoride, PCBM fullerene compound, fullerene polymer, etc.)), oxazole derivatives, oxadiazole derivatives, or triazole derivatives. Further, it includes a heterocyclic compound containing a nitrogen atom, an oxygen atom and a sulfur atom, for example, organic molecules and organometallic complexes having pyridine derivatives, pyrazine derivatives, pyrimidine derivatives, triazine derivatives, quinoline derivatives, quinoxaline derivatives, isoquinoline derivatives, acridine derivatives, phenazine derivatives, phenanthroline derivatives, tetrazole derivatives, pyrazole derivatives, imidazole derivatives, thiazole derivatives, imidazole derivatives, benzimidazole derivatives, benzotriazole derivatives, benzoxazole derivatives, benzoxazole derivatives, carbazole derivatives, benzofuran derivatives, dibenzofuran derivatives, subporphyrazine derivative, polyphenylene vinylene derivatives, polybenzothiadiazole derivatives, polyfluorene derivatives and the like a part of the molecular skeleton, and subphthalocyanine derivatives. Examples of a functional group or the like included in fullerene derivatives include a halogen atom; a linear, branched or cyclic alkyl group or phenyl group; a functional group having a linear or condensed aromatic compound; a functional group having a halide; a partial fluoroalkyl group; a perfluoroalkyl group; a silylalkyl group; a silylalkoxy group; an arylsilyl group; an arylsulfanyl group; an alkylsulfanyl group; an arylsulfonyl group; an alkylsulfonyl group; an arylsulfide group; an alkylsulfide group; an amino group; an alkylamino group; an arylamino group; a hydroxy group; an alkoxy group; an acylamino group; an acyloxy group; a carbonyl group; a carboxy group; a carboxamide group; a carboalkoxy group; an acyl group; a sulfonyl group; a cyano group; a nitro group; a functional group having a chalcogenide; a phosphine group; a phosphonic group; derivatives thereof.

Specific examples of the hole transport material include thiophene derivatives, benzothieno-benzothiophene derivatives, ferrocene derivatives, paraphenylenevinylene derivatives, carbazole derivatives, pyrrole derivatives, aniline derivatives, diamine derivatives, phthalocyanine derivatives, subphthalocyanine derivatives, hydrozone derivatives, naphthalene derivatives, anthracene derivatives, phenanthrene derivatives, pyrene derivatives, perylene derivatives, tetracene derivatives, pentacene derivatives, quinacridone derivatives, thienothiophene derivatives, benzothiophene derivatives, triallylamine derivatives, perylene derivatives, picene derivatives, chrysene derivatives, fluoranthene derivatives, subporphyrazine derivatives, a metallic complex having a heteocyclic compound as a ligand, polythiophene derivatives, polybenzothiadiazole derivatives, polyfluorene derivatives.

It is desirable for the hole mobility of the hole transport material to be $1\times10^{-5}$ cm$^2$/V·s or higher, preferably $1\times10^{-4}$ cm$^2$/V·s or higher, and more preferably $1\times10^{-2}$ cm$^2$/V·s or higher.

As mixing proportions of the electron transport material, the optical absorption organic semiconductor material, and the hole transport material in the organic photoelectric conversion layer, the following numbers can be exemplified (provided that the total proportion is 100 vol %).

Optical absorption organic semiconductor material: 30 vol % to 80 vol %

Electron transport material: 10 vol % to 35 vol %

Hole transport material: 10 vol % to 60 vol %

A second charge injection blocking layer may be provided between the organic photoelectric conversion layer and a second electrode. The second charge injection blocking layer functions as an electron injection blocking layer. As materials forming the second charge injection blocking layer, a hole-accepting organic material can be used, and specific examples thereof include fullerenes beginning from C60 or C70, carbon nanotubes, and derivatives thereof, oxadiazole derivatives such as 1,3-bis(4-tert-butylphenyl-1, 3,4-oxadiazolyl)phenylene (OXD-7), anthraquinodimethane derivatives, diphenylquinone derivatives, bathocuproine, bathophenanthroline, and derivatives thereof, triazole derivatives, tris(8-hydroxyquinolinate)aluminum complexes, bis(4-methyl-8-quinolinate)aluminum complexes, distyrylarylene derivatives, silole compounds, and the like.

It is desirable for the absorption coefficient α (cm$^{-1}$) of the organic photoelectric conversion layer to be $1\times10^5$ or higher, preferably $1.5\times10^5$ or higher, more preferably $2\times10^5$ or higher, and even more preferably $2.5\times10^5$ or higher. It is desirable for the sublimation temperature of the material forming the organic photoelectric conversion layer under the atmosphere to be 250° C. or higher. Examples of the total molecular weight of the organic photoelectric conversion layer are 2000 or lower, preferably 500 to 1500, and more preferably 500 to 1000. The wavelength of the light absorption peak in the light absorption spectrum of the organic photoelectric conversion layer may be within the visible light range. In addition, the light absorption spectrum of the organic photoelectric conversion layer may have one maximum value in the visible light range. Although a thickness of the organic photoelectric conversion layer is not limited, for example, a thickness in the range of $1\times10^{-8}$ m to $5\times10^{-7}$ m, and preferably a thickness in the range of $2.5\times10^{-8}$ m to $3\times10^{-7}$ m may be exemplified.

Since the optical absorption organic semiconductor material is photoelectrically converted in a desired color gamut, an absorption spectrum is important. In order to match an absorption end to the desired color gamut, for example, it is necessary to set a band gap energy to about 1.9 eV in the case of red, about 2.0 eV in the case of green, and about 2.5 eV in the case of blue. Here, specific examples of the optical absorption organic semiconductor material include phthalocyanine derivatives, subphthalocyanine derivatives, quinacridone-based derivatives, naphthalocyanine derivatives, squarylium derivatives, etc. In the first-type blue organic photoelectric conversion layer, the first-type green organic photoelectric conversion layer, and the first-type red organic photoelectric conversion layer described above, the same material may be used as the electron transport material and the hole transport material and only the optical absorption organic semiconductor material may be changed.

As organic pigment materials forming the organic photoelectric conversion layer that photoelectrically converts light having a wavelength of green (495 nm to 570 nm), for example, pigment-violet-based pigments, pigment-red-based pigments, rhodamine-based pigments, melacyanine pigments, subphthalocyanine-based pigments (subphthalocyanine derivatives), quinacridone derivatives, and the like can be exemplified. As organic pigment materials forming the organic photoelectric conversion layer that photoelectrically converts blue light (having a wavelength of 425 nm to 495 nm), for example, naphthalene derivatives, anthracene derivatives, naftasen derivatives, styrylamine derivatives, bis(azinil)methene boron complexes, coumarin-based pigments, tris-8-hydroxyquinoline aluminum (Alq3), meracyanine-based pigments, and the like can be exemplified. As organic pigment materials forming the organic photoelectric conversion layer that photoelectrically converts red light (having a wavelength of 620 nm to 750 nm), for example, nile red, pyrane derivatives such as DCM1{4-(dicyanomethylene)-2-methyl-6-(4-dimethylaminostyryl)4H-pyrane} and DCJT{4-(dicyanomethylene)-2-tert-butyl-6-(julolidylstyryl)pyrane}, squarylium derivatives, porphyrin derivatives, chlorin derivatives, yurodirin derivatives, phthalocyanine-based pigments, subphthalocyanine-based pigments (subphthalocyanine derivatives), and the like can be exemplified. In addition, "organic pigment materials" include "organic dye materials."

A dry film formation method and a wet film formation method may be given as examples of a film-forming method for various organic layers including an organic photoelectric conversion layer. Examples of the dry film formation method include a vacuum deposition method using resistance heating, high frequency or electron beam heating, a flash deposition method, a plasma deposition method, an EB deposition method, various sputtering method (bipolar sputtering method, direct current sputtering method, DC magnetron sputtering method, RF-DC coupled bias sputtering method, ECR sputtering method, facing-target sputtering method, high frequency sputtering method and ion beam sputtering method), a DC (direct current) method, an RF method, a multi-cathode method, an activation reaction method, an electric field vapor deposition method, a high-frequency ion plating method and a reactive ion plating method, a laser ablation method, a molecular beam epitaxy method, a laser transfer method, and a molecular beam epitaxy (MBE) method. Furthermore, examples of a chemical vapor deposition (CVD) method include a plasma CVD method, a thermal CVD method, an MOCVD method, and a photo CVD method. On the other hand, as a coating method, a spin coating method; a dipping method; a casting method; a micro contact printing method; a drop casting method; various printing methods such as a screen printing method, an ink jet printing method, an offset printing method, a gravure printing method and a flexographic printing method; a stamping method; a spray coating method; various coating methods such as an air doctor coater method, a blade coater method, a rod coater method, a knife coater method, a squeeze coater method, a reverse roll coater method, a transfer roll coater method, a gravure coater method, a kiss coater method, a cast coater method, a spray coater method, a slit orifice coater method and a calendar coater method. Further, examples of a solvent in the coating method include a nonpolar or low polar organic solvents such as toluene, chloroform, hexane, and ethanol, however, the solvent is not limited thereto. As for patterning, chemical etching such as shadow mask, laser transfer, photolithography and the like, physical etching by ultraviolet light, laser and the like may be used. Examples of a planarization technique for various organic layers include a laser planarization method, a reflow method, etc. Alternatively, in a case in which imaging elements are integrated as an imaging element forming a solid-state imaging apparatus, a method of forming a pattern using a pulsed laser deposition method (PDL method) can be employed.

In the imaging element or the like according to an embodiment of the present disclosure including various preferred modes and configurations described above, light is radiated, photoelectric conversion is generated on the organic photoelectric conversion layer, carriers including holes and electrons are separated. Further, an electrode from which holes are extracted is referred to as an anode, and an electrode from which electrons are extracted is defined as a cathode. The first electrode may form a cathode, and the second electrode may form an anode. The electrode positioned on the opposite side to the light incidence side having the organic photoelectric conversion layer therebetween may be referred to as "one electrode" and the electrode positioned on the light incidence side may be referred to as "the other electrode."

In the imaging element or the like according to an embodiment of the present disclosure including various preferred modes described above, light may be incident on the organic photoelectric conversion layer through the first electrode or incident on the organic photoelectric conversion layer through the second electrode. The first electrode and the second electrode may be formed of a transparent conductive material. Alternatively, one electrode may be formed of a metal material and the other electrode may be formed of a transparent conductive material. One electrode is provided for each imaging element. The other electrode may be shared by a plurality of imaging elements. That is, the other electrode may be set as a so-called solid electrode. The organic photoelectric conversion layer may be shared by a plurality of imaging elements or provided for each imaging element.

Specific examples of the imaging element according to an embodiment of the present disclosure include an imaging element (for convenience, referred to as a "first-type blue imaging element") having an organic photoelectric conversion layer which absorbs blue light (light of 425 nm to 495 nm) (for convenience, referred to as a "first-type blue organic photoelectric conversion layer") and having sensitivity to blue, an imaging element (for convenience, referred to as a "first-type green imaging element") having an organic photoelectric conversion layer which absorbs green light (light of 495 nm to 570 nm) (for convenience, referred to as a "first-type green organic photoelectric conversion layer") and having sensitivity to green, and an imaging element (for convenience, referred to as a "first-type red imaging element") having an organic photoelectric conversion layer which absorbs red light (light of 620 nm to 750 nm) (for convenience, referred to as a "first-type red organic photoelectric conversion layer") and having sensitivity to red. Further, in the conventional imaging element, an imaging element sensitive to blue is, for convenience, referred to as "second type blue imaging element", and an imaging element sensitive to green is, for convenience, referred to as "second type green imaging element", an imaging element sensitive to red is, for convenience, referred to as "second type red imaging element", a photoelectric conversion layer forming the second type blue imaging element is, for convenience, referred to as "second type blue photoelectric conversion layer", a photoelectric conversion layer forming the second type green imaging element is, for convenience, referred to as "second type green photoelectric conversion layer", and a photoelectric conversion layer forming the second type red imaging element is, for convenience, referred to as "second type red photoelectric conversion layer."

The stacked-type imaging element according to an embodiment of the present disclosure includes at least one imaging element (photoelectric conversion element) according to an embodiment of the present disclosure, and specifically, for example, in a case in which the stacked structure of the first electrode, the organic photoelectric conversion layer, the second electrode, and the like is called a "photoelectric conversion unit,"

[A] the configuration and structure in which the first type blue organic photoelectric conversion unit, the first type green organic photoelectric conversion unit and the first type red organic photoelectric conversion unit are stacked in the vertical direction, and each of the control units of the first type blue imaging element, the first type green imaging element, and the first type red imaging element is provided on the semiconductor substrate;

[B] the configuration and structure in which the first type blue organic photoelectric conversion unit and the first type green organic photoelectric conversion unit are stacked in the vertical direction, the second-type red photoelectric conversion layer is disposed below these two layers of the first type organic photoelectric conversion units, and each of the control units of the first type blue imaging element, the first type green imaging element, and the second type red imaging element is provided on the semiconductor substrate;

[C] the configuration and structure in which the second-type blue photoelectric conversion unit and the second-type red photoelectric conversion unit are disposed below the first-type green organic photoelectric conversion unit, and each of the control units of the first type green imaging element, the second type blue imaging element, and the second type red imaging element is provided on the semiconductor substrate; and

[D] the configuration and structure in which the second-type green photoelectric conversion unit and the second-type red photoelectric conversion unit are disposed below the first-type blue organic photoelectric conversion unit, and each of the control units of the first type blue imaging element, the second type green imaging element, and the second type red imaging element is provided on the semiconductor substrate.

One pixel is formed by the stacked structure of these imaging elements. Furthermore, the first-type infrared organic photoelectric conversion unit may be provided. Here, it is preferable that the organic photoelectric conversion layer of the first-type infrared photoelectric conversion unit may be formed of an organic material, and is the lowermost layer of the stacked structure of the first-type imaging element, and is disposed above the second-type imaging element. Alternatively, the second-type infrared photoelectric conversion unit may be provided below the first-type organic photoelectric conversion unit. In the first-type imaging element, for example, the first electrode or the second electrode is formed on an interlayer insulating layer provided on the semiconductor substrate.

In the case of forming a stacked-type imaging element, the first electrode and the second electrode can be formed of a transparent conductive material. Alternatively, in a case in which the imaging elements or the like of the present disclosure are arranged in a plane shape like, for example, a Bayer array, the one electrode may be formed of a metal material (formed of, e.g., Al—Nd (an alloy of aluminum and neodymium) or ASC (an alloy of aluminum, silicon, and copper)), and the other electrode may be formed of a transparent conductive material. Here, "transparent conductive material" refers to a material that does not excessively absorb incident light toward the organic photoelectric conversion layer. Further, an electrode formed of a transparent conductive material may be referred to as a "transparent electrode." Here, the band gap energy of the transparent conductive material is 2.5 eV or more, and preferably, 3.1 eV or more. Examples of a transparent conductive material forming an transparent electrode include conductive metal oxides, and specific examples thereof include indium oxide, indium-tin oxide (ITO including Sn-doped $In_2O_3$, crystalline ITO and amorphous ITO), indium-zinc oxide (IZO) in which indium is added to zinc oxide as a dopant, indium-gallium oxide (IGO) in which indium is added to gallium oxide as a dopant, indium-gallium-zinc oxide (IGZO, In—$GaZnO_4$) in which indium and gallium are added to zinc oxide as a dopant, IFO (F-doped $In_2O_3$), tin oxide ($SnO_2$), ATO (Sb-doped $SnO_2$), FTO (F-doped $SnO_2$), zinc oxide (including ZnO doped with other elements), aluminum-zinc oxide (AZO) in which aluminum is added to zinc oxide as a dopant, gallium-zinc oxide (GZO) in which gallium is added to zinc oxide as a dopant, boron-zinc oxide in which boron is added to zinc oxide as a dopant, titanium oxide ($TiO_2$), antimony oxide, spinel type oxide, an oxide having a $YbFe_2O_4$ structure. Alternatively, a transparent electrode having a base layer of gallium oxide, titanium oxide, niobium oxide, nickel oxide or the like may be given as an example. The thickness of the transparent electrode may be $2 \times 10^{-8}$ m to $2 \times 10^{-7}$ m, preferably $3 \times 10^{-8}$ m to $1 \times 10^{-7}$ m.

In a case in which transparency is unnecessary, as conductive materials forming an anode electrode from which holes are extracted (positive pole), a conductive materials having a high work function (e.g., $\varphi=4.5$ eV to 5.5 eV) can be exemplified, and specifically, gold (Au), silver (Ag), chromium (Cr), nickel (Ni), palladium (Pd), platinum (Pt), iron (Fe), iridium (Ir), germanium (Ge), osmium (OS), rhenium (Re), and tellurium (Te) may be exemplified. On the other hand, as conductive materials for a cathode electrode from which electrons are extracted, a conductive material having a low work function (e.g., $\varphi=3.5$ eV to 4.5 eV) may be exemplified, and specifically, an alkali metal (e.g., Li, Na, K, etc.) or a fluoride or oxide thereof, an alkali earth metal (e.g., Mg, Ca, etc.) or a fluoride or oxide thereof, aluminum (Al), zinc (Zn), tin (Sn), thallium (Tl), a sodium-potassium alloy, an aluminum-lithium alloy, a magnesium-silver alloy, indium, a rare earth metal such as ytterbium, or an alloy thereof may be exemplified. Alternatively, as a material forming the first electrode and the second electrode, a metal such as platinum (Pt), gold (Au), palladium (Pd), chromium (Cr), nickel (Ni), aluminum (Al), silver (Ag), tantalum (Ta), tungsten (W), copper (Cu), titanium (Ti), indium (In), tin (Sn), iron (Fe), cobalt (Co), molybdenum (Mo), or the like, an alloy including the metal elements, conductive particles formed of the metals, conductive particles of an alloy formed of the metals, polysilicon containing impurities, a carbon-based material, an oxide semiconductor, or a conductive substance (material) such as carbon nanotubes may be exemplified, and a stacked structure of layers including these elements may also be employed. Furthermore, as a material forming the first electrode and the second electrode, an organic material such as poly(3,4-ethylenedioxythiophene)/polystyrene sulfonate [PEDOT/PSS] (conductive polymer) may also be exemplified. In addition, a substance obtained by mixing the conductive material with a binder (polymer) to make it into a paste or an ink and then curing it may be used as an electrode. The electrode may also have a structure in which two or more layers formed of different materials are stacked.

A dry method or wet method may be used as a film-forming method of the first electrode or the like (cathode) and the second electrode (anode). Examples of the dry method include a physical vapor deposition method (PVD method) and a chemical vapor deposition method (CVD) method. Examples of the film-forming method using the principle of PVD method include a vacuum evaporation method using resistance heating or high frequency heating, an electron beam (EB) evaporation method, various sputtering methods (magnetron sputtering method, RF-DC coupled bias sputtering method, ECR sputtering method, facing-target sputtering method and high frequency sputtering method), an ion plating method, a laser ablation method, a molecular beam epitaxy method, and a laser transfer method. Furthermore, examples of the CVD method include a plasma CVD method, a thermal CVD method, an organic metal (MO) CVD method, and a photo CVD method. On the other hand, examples of the wet method include a spin coating method, a spray coating method, a stamp method, a micro contact printing method, a screen printing method, an inkjet printing method, an offset printing method, a gravure printing method, a flexo printing method, a dip method, and the like. Alternatively, examples of the wet method include a lift-off method; a sol-gel method; an electrodeposition method; a shadow mask method; a plating method such as an electrolytic plating method, an electroless plating method, or a combination thereof; and a combination of any one of spraying methods and a patterning technique if necessary. Surfaces of the first electrode and the second electrode may also be processed using oxygen plasma, argon plasma, nitrogen plasma, ozone, or the like. This processing can be performed regardless of the presence or absence of a coating layer (which will be described below), or before and after coating. As for patterning, chemical etching such as shadow mask, laser transfer, photolithography and the like, physical etching by ultraviolet light, laser and the like may be used. Examples of a planarization technique for the first electrode and second electrode include a laser planarization method, a reflow method, a chemical mechanical polishing (CMP) method, etc.

In the imaging element or the like of the present disclosure including the preferred modes described above, the one electrode formed of a transparent conductive material is formed on a transparent substrate, the organic photoelectric conversion layer is formed on the one electrode, and the other electrode may be formed on the organic photoelectric conversion layer. Alternatively, the one electrode may be formed on a substrate, the organic photoelectric conversion layer may be formed on the one electrode, and the other electrode formed of a transparent conductive material may be formed on the organic photoelectric conversion layer. Here, although the first electrode and the second electrode are separated, the form in which the second electrode is provided above the first electrode may be exemplified, or the form in which the first electrode is provided above the second electrode may be exemplified as such a separation state.

Alternatively, the photoelectric conversion unit may be disposed above a semiconductor substrate through the interlayer insulating layer, and one of the electrodes included in the imaging element may be connected to a charge storage portion (a floating diffusion layer) formed in the semiconductor substrate to store a charge generated in the organic photoelectric conversion layer and a gate portion of an amplification transistor formed in the semiconductor substrate. In this configuration, a reset transistor and a select transistor included in the control unit are further provided in the semiconductor substrate. The charge storage portion may be connected to one of source and drain regions of the reset transistor. One of source and drain regions of the amplification transistor may be connected to one of source and drain regions of the select transistor and the other of the source and drain regions of the select transistor may be connected to a signal line.

The configuration and structure of the amplification transistor, reset transistor and select transistor forming the control unit may be the same as the conventional amplification transistor, reset transistor and select transistor. The charge storage portion (the floating diffusion layer) can be configured from a high-concentration impurity region provided in the semiconductor substrate. Also, the drive circuit may have well-known configuration and structure. One of the electrodes is connected to the charge storage portion (the floating diffusion layer) and the gate section of the amplification transistor, and a contact hole portion may be formed to connect one of the electrodes to the charge storage portion and the gate section of the amplification transistor. Examples of a material forming the contact hole portion include a high melting point metal such as tungsten, Ti, Pt, Pd, Cu, TiW, TiN, TiNW, $WSi_2$, $MoSi_2$ or the like, metal silicide, or a stacked structure of layers formed of these materials (e.g., Ti/TiN/W).

The electrodes and the organic photoelectric conversion layer may be covered by a coating layer in some cases. Examples of materials forming the coating layer or the interlayer insulating layer include inorganic insulating materials exemplified by silicon oxide-based materials; silicon nitride ($SiN_Y$); a metal oxide high-dielectric constant insulating film such as aluminum oxide ($Al_2O_3$) or the like as well as organic insulating materials (organic polymers) exemplified by polymethyl methacrylate (PMMA); polyvinyl phenol (PVP); polyvinyl alcohol ($PV_A$); polyimide, polycarbonate (PC); polyethylene terephthalate (PET); polystyrene; silanol derivatives (silane coupling agents) such as N-2 (aminoethyl) 3-aminopropyltrimethoxysilane (AEAPTMS), 3-mercaptopropyltrimethoxysilane (MPTMS), octadecyltrichlorosilane (OTS) or the like; straight-chain hydrocarbons having a functional group capable of bonding to the electrode at one end such as octadecanethiol, dodecyl isocyanate and the like, and combinations thereof. In addition, examples of the silicon oxide-based materials include silicon oxide ($SiO_X$), BPSG, PSG, BSG, AsSG, PbSG, silicon oxynitride (SiON), spin-on-glass (SOG), and low dielectric constant materials (e.g., polyaryl ether, cycloperfluorocarbon polymers and benzocyclobutene, cyclic fluoro resins, polytetrafluoroethylene, fluoroaryl ether, fluorinated polyimide, amorphous carbon and organic SOG).

Examples of the substrate include organic polymers exemplified by polymethyl methacrylate (polymethylmethacrylate or PMMA), polyvinyl alcohol (PVA), polyvinyl phenol (PVP), polyethersulfone (PES), polyimide, polycarbonate (PC), polyethylene terephthalate (PET), or polyethylene naphthalate (PEN) (having a form of a polymeric material such as a plastic film, a plastic sheet, or a plastic substrate formed of a polymeric material having flexibility), or mica. If a substrate formed of such a polymeric material having flexibility is used, for example, incorporation or integration of an electronic device with an electronic apparatus having a curved surface shape is possible. Alternatively, examples of the substrate include silicon semiconductor substrates, various glass substrates, various glass substrates with an insulating material film formed on their surfaces, quartz substrates, quartz substrates with an insulating material film formed on their surfaces, silicon semiconductor substrates with an insulating material film formed on their surfaces, various alloys such as stainless steel, and metal substrates formed of various metals. In addition, examples of an insulating material film include a silicon oxide-based material (e.g., $SiO_X$ or spin-on-glass (SOG)); silicon nitride ($SiN_Y$); silicon oxynitride (SiON); aluminum oxide ($Al_2O_3$); a metal oxide or a metal salt. In addition, a conductive substrate with such an insulating material film formed on a surface (a substrate formed of a metal such as gold or aluminum, or a substrate formed of highly-oriented graphite) may also be used. Although it is desirable for the surface of the substrate to be smooth, it does not matter if it has roughness to the extent that it does not adversely affect characteristics of the organic photoelectric conversion layer. By forming a silanol derivative on the surface of the substrate using a silane coupling method, forming a thin film formed of a thiol derivative, a carboxylic acid derivative, a phosphoric acid derivative, or the like thereon using an SAM method or the like, or forming a thin film formed of an insulating metal salt or metal complex using a CVD method or the like, adhesion between the first electrode or the second electrode and the substrate may be improved. A transparent substrate is a substrate formed of a material that does not excessively absorb light incident on the organic photoelectric conversion layer through the substrate.

The electrodes and the organic photoelectric conversion layer may be covered by a coating layer in some cases. Examples of materials forming the coating layer include inorganic insulating materials exemplified by silicon oxide-based materials; silicon nitride ($SiN_Y$); a metal oxide high-dielectric constant insulating film such as aluminum oxide ($Al_2O_3$) or the like as well as organic insulating materials (organic polymers) exemplified by polymethyl methacrylate (PMMA); polyvinyl phenol (PVP); polyvinyl alcohol ($PV_A$); polyimide, polycarbonate (PC); polyethylene terephthalate (PET); polystyrene; silanol derivatives (silane coupling agents) such as N-2 (aminoethyl) 3-aminopropyltrimethoxysilane (AEAPTMS), 3-mercaptopropyltrimethoxysilane (MPTMS), octadecyltrichlorosilane (OTS) or the like; straight-chain hydrocarbons having a functional group capable of bonding to the electrode at one end such as octadecanethiol, dodecyl isocyanate and the like, and combinations thereof. In addition, examples of the silicon oxide-based materials include silicon oxide ($SiO_X$), BPSG, PSG, BSG, AsSG, PbSG, silicon oxynitride (SiON), spin-on-glass (SOG), and low dielectric constant materials (e.g., polyaryl ether, cycloperfluorocarbon polymers and benzocyclobutene, cyclic fluoro resins, polytetrafluoroethylene, fluoroaryl ether, fluorinated polyimide, amorphous carbon and organic SOG).

The solid-state imaging apparatus may be a front surface illuminated type or a back surface illuminated type, or may be a single plate color solid-state imaging apparatus. In addition, an on-chip micro lens or a light shielding layer may be provided in the imaging element if necessary. Examples of materials forming the light shielding layer include chromium (Cr), copper (Cu), aluminum (Al), and tungsten (W). A shutter for controlling incidence of light on the imaging element may be installed if necessary, and an optical cut filter may be included therein in accordance with a purpose of the solid-state imaging apparatus. A drive circuit or wiring for driving the imaging element is provided. In addition, the imaging element or the like of the present disclosure may form an optical sensor, an image sensor, and a solar cell in addition to a solid-state imaging apparatus such as a television camera.

In the solid-state imaging apparatus according to the second aspect of the present disclosure including the stacked-type imaging element, unlike the solid-state imaging apparatus including the Bayer-array imaging element (i.e., spectroscopy for blue, green, and red is not performed using an on-chip color filter), elements having sensitivity to light of plural types of wavelengths are stacked in the light incidence direction in the same pixel to form one pixel, and thus improvement of sensitivity and pixel density per unit volume can be achieve. Furthermore, since an organic material has a high absorption coefficient, a film thickness of a photoelectric conversion layer can be thinner as compared to a conventional Si-based photoelectric conversion layer, and light leakage from adjacent pixels and restriction on the light incidence angle can be alleviated. Moreover, since the conventional Si-based imaging element produces color signals by performing interpolation processing among three-color pixels, false color is generated, but false color can be suppressed in the solid-state imaging apparatus according to the second aspect of the present disclosure including the stacked-type imaging element. Further, since the organic photoelectric conversion layer itself functions as an on-chip color filter, color separation can be performed without disposing an on-chip color filter.

On the other hand, in the solid-state imaging apparatus according to the first aspect of the present disclosure, due to using an on-chip color filter, the request for spectral characteristics of blue, green and red can be alleviated, and moreover, mass productivity is high. Examples of the arrangement of the imaging element in the solid-state imaging apparatus according to the first aspect of the present disclosure include an interline arrangement, a G stripe-RB checkered array, a G stripe-RB full-checkered array, a checkered complementary color array, a stripe array, a diagonal stripe array, a primary color difference array, a field color difference sequential array, a flame color difference sequential array, an MOS-type array, a modified MOS-type array, a flame interleave array and a field interleave array in addition to a Bayer array. Here, one pixel (or subpixel) is formed by one imaging element.

A pixel region in which a plurality of the imaging elements according to an embodiment of the present disclosure or the stacked-type imaging elements according to an embodiment of the present disclosure are arrayed is formed of a plurality of pixels regularly arranged in a two-dimensional array. Generally, the pixel region includes an effective pixel region which actually receives light, amplifies the signal charges generated by photoelectric conversion and reads it out to the drive circuit, and a black reference pixel region for outputting optical black serving as a reference of a black level. The black reference pixel region is generally disposed at the outer peripheral portion of the effective pixel region.

For example, in a case where the solid-state imaging apparatus is stacked with a readout integrated circuit (ROIC), the stacking may be performed by overlaying a drive substrate on which a readout integrated circuit and a connection portion formed of copper (Cu) are formed and an imaging element on which a connection portion is formed such that the connection portions are in contact with each other, and joining the connection portions, and it is also possible to join the connection portions using a solder bump or the like.

Embodiment 1

Embodiment 1 relates to the imaging element of the present disclosure and a photoelectric conversion element of the present disclosure.

Figure 1B:
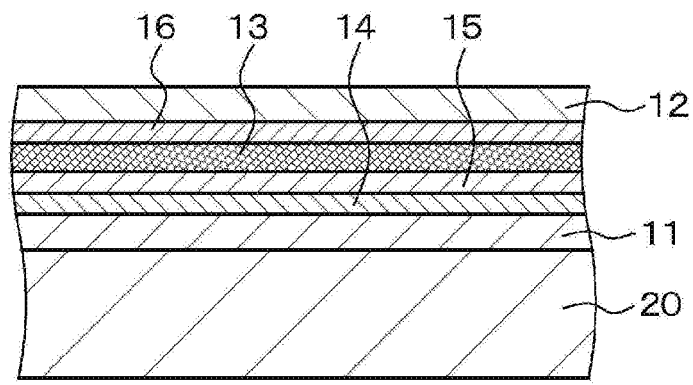

As in a conceptual diagram shown in a sectional view illustrated in FIG. 1A or FIG. 1B, the imaging element or photoelectric conversion element of Embodiment 1 has a stacked structure including a first electrode 11, an organic photoelectric conversion layer 13, and a second electrode 12, and a first organic material layer 14 and a second organic material layer 15 are formed between the first electrode 11 and the organic photoelectric conversion layer 13 from the first electrode side.

Specifically, for example, the second electrode 12 formed of aluminum (Al), the electron injection blocking layer 16, the organic photoelectric conversion layer 13, the second organic material layer (cohesion suppressing layer or diffusion prevention layer) 15, the first organic material layer (charge injection blocking layer) 14, and the first electrode 11 formed of ITO are formed on a support substrate 20 formed of quartz using, for example, a vacuum evaporation method as illustrated in FIG. 1A. Alternatively, specifically, the first electrode 11 formed of aluminum (Al), the first organic material layer (charge injection blocking layer) 14, the second organic material layer (base layer) 15, the organic photoelectric conversion layer 13, the electron injection blocking layer 16, and the second electrode 12 formed of ITO are formed on the support substrate 20 formed of quartz using, for example, a vacuum evaporation method as illustrated in FIG. 1B.

Here, the first organic material layer 14 specifically functions as a charge injection blocking layer, and more specifically functions as a hole injection blocking layer. In addition, the first organic material layer 14 is formed of a material having a naphthalene diimide (NDI) structure (or a naphthalene-1,4,5,8-tetra carboxylic acid diimide structure), and specifically, a material expressed by the following structural formula (1) or naphthalene-1,4,5,8-tetra carboxylic acid diimide. In addition, a LUMO value of a material forming the first organic material layer 14 is deeper than −3.9 eV and a HOMO value thereof is deeper than −6.2 eV. Specifically, a LUMO value of a material (naphthalene-1,4,5,8-tetra carboxylic acid diimide) forming the first organic material layer 14 is −4.8 eV and a HOMO value thereof is −7.9 eV.

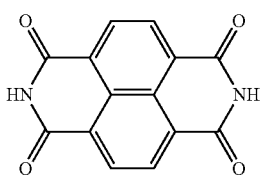

(1)

In addition, the second organic material layer 15 functions as a base layer or as a cohesion suppressing layer or a diffusion prevention layer. Specifically, the second organic material layer 15 is formed of a material having a pyridine end, more specifically a material expressed by the following structural formula (2), or 1,3-bisbipyridyl-5-terpyridylbenzene (BBTB). A glass transition temperature of a material forming the second organic material layer 15 is 160° C. or higher, and specifically 170° C. A thickness of each layer was set as follows.

First electrode 11: $1 \times 10^{-7}$ m

First organic material layer 14: $1 \times 10^{-8}$ m

Second organic material layer 15: $1 \times 10^{-8}$ m

Organic photoelectric conversion layer 13: $2 \times 10^{-7}$ m

Electron injection blocking layer 16: $1 \times 10^{-8}$ m

Second electrode 12: $1 \times 10^{-7}$ m

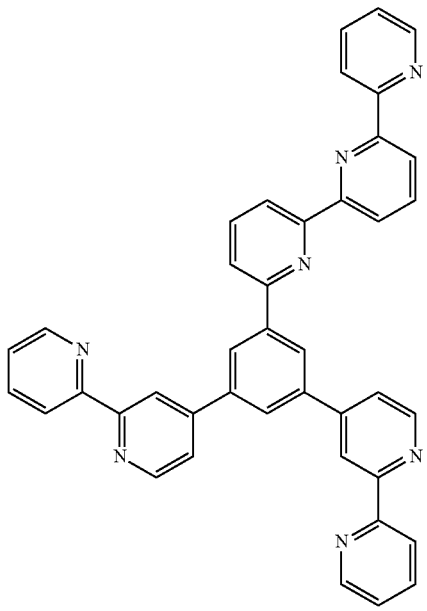

(2)

Furthermore, the organic photoelectric conversion layer 13 is formed of a material having a bulk heterostructure including a hole transport material and an electron transport material. The organic photoelectric conversion layer 13 further includes an optical absorption organic semiconductor material, having the bulk heterostructure including the hole transport material, the electron transport material, and the optical absorption organic semiconductor material. A benzothienobenzothiophene derivative was used as the hole transport material, fullerene C60 was used as the electron transport material, and "F6SubPc-OC6F5" expressed by the structural formula (18) was used as the optical absorption organic semiconductor material. An example of the mixing proportions of the electron transport material, the optical absorption organic semiconductor material, and the hole transport material may be:

electron transport material:optical absorption organic semiconductor material:hole transport material=20 vol %:40 vol %:40 vol %;

however, the proportions are not limited to the values. The organic photoelectric conversion layer 13 has a maximum light absorption wavelength in the range of 450 nm to 650 nm.

In addition, in the wavelength range of 450 nm to 700 nm, a maximum value of the light absorption coefficient of the optical absorption organic semiconductor material is greater than the value of the light absorption coefficient of the electron transport material or greater than the value of the light absorption coefficient of the hole transport material, or greater than the value of the light absorption coefficients of the electron transport material and the hole transport material. In addition, the value $\mu_3$ of ray absorption coefficient of the optical absorption organic semiconductor material at the maximum light absorption wavelength in the visible light range is greater than the value $\mu_1$ of the ray absorption coefficient of the hole transport material at the maximum light absorption wavelength in the visible light range and greater than the value $\mu_2$ of the ray absorption coefficient of the electron transport material at the maximum light absorption wavelength in the visible light range. Specifically, the values of the light absorption coefficient and the ray extinction coefficient of the above materials are shown in the following table 1. The electron transport material and the hole transport material do not have a light absorption peak with respect to visible light.

TABLE 1

Maximum value of light absorption coefficient of optical absorption organic semiconductor material: $2.2 \times 10^5$ cm$^{-1}$
Value of light absorption coefficient of electron transport material: $1.0 \times 10^5$ cm$^{-1}$
Value of light absorption coefficient of hole transport material: $8.6 \times 10^4$ cm$^{-1}$
Ray absorption coefficient of optical absorption organic semiconductor material: $\mu_3 = 2.6 \times 10^5$ cm$^{-1}$
Ray absorption coefficient of electron transport material: $\mu_2 = 0$ cm$^{-1}$, and no absorption of green light region
Ray absorption coefficient of hole transport material: $\mu_1 = 0$ cm$^{-1}$, and no absorption of green light region As Comparative example 1A, an imaging element without the second organic material layer 15 formed therein was produced. That is, the imaging element of Comparative example 1A in which the second electrode 12 formed of aluminum (Al), the electron injection blocking layer 16, the organic photoelectric conversion layer 13 having the above-described composition, the first organic material layer 14, and the first electrode 11 formed of ITO were formed on the support substrate 20 formed of quartz using a vacuum evaporation method was produced.

As Comparative example 1B, an imaging element without the first organic material layer 14 formed therein was produced. That is, the imaging element of Comparative example 1B in which the second electrode 12 formed of aluminum (Al), the electron injection blocking layer 16, the organic photoelectric conversion layer 13 having the above-described composition, the second organic material layer 15, and the first electrode 11 formed of ITO were formed on the support substrate 20 formed of quartz using a vacuum evaporation method was produced.

As Comparative example 1C, the staking order of the first organic material layer 14 and the second organic material layer 15 was reversed. That is, the imaging element of Comparative example 1C in which the second electrode 12 formed of aluminum (Al), the electron injection blocking layer 16, the organic photoelectric conversion layer 13 having the above-described composition, the first organic material layer 14, the second organic material layer 15, and the first electrode 11 formed of ITO were formed on the support substrate 20 formed of quartz using a vacuum evaporation method was produced.

The first electrode 11 of the imaging element produced in a dark box was grounded, a reverse-bias voltage was applied to the second electrode 12 and thereby a current flowing in the imaging element was detected, and then dark current pressure resistance performance was evaluated. Here, the dark current value [$J_{dk}$ (−3.0 V)] when the bias voltage was set to −3.0 V was set as the dark current pressure resistance performance. The unit is $10^{-10}$ Ampere. The results are shown in table 2.

In addition, the external quantum efficiency (EQE) of the organic photoelectric conversion layer in the light amount when photocurrent density is 1 micro ampere/cm$^2$ in a state in which a voltage equivalent to the electric field intensity of −5.0×10$^5$ V/cm was applied to the second electrode 12 was calculated. Furthermore, in order to evaluate the change of the dark current and EQE of the imaging element over time, a high temperature operation life test was performed. The high temperature operation life test is a test for checking reliability and durability of the imaging element in a case in which the imaging element is operated for a long period of time under a high temperature, and the imaging element is energized at a high temperature under a designated condition and deterioration thereof is checked. The high temperature operation life test was performed for 24 hours under conditions of incident light irradiance of 1000 watt/m2, a measured temperature of 60° C., and a bias voltage of −3.0 V as conditions for the high temperature operation life test of this time, and the dark current ($J_{dk}$) and EQE were measured using the above-described method. Table 2 shows the results of the dark current pressure resistance performance evaluation [they are shown in the section of $J_{dk}$ (−3.0 V) in the table 2]. In addition, a dark current variation rate ($J_{dk}$ variation rate) and an EQE variation rate were obtained. The variation rates are values obtained by dividing the values of the dark current and EQE after 24 hours by the initial values. It is determined on the basis of the table 2 that Embodiment 1 shows a lower value of $J_{dk}$ (−3.0 V) and a smaller change in the value of EQE over time than in any of Comparative example 1A, Comparative example 1B, Comparative example 1C, and further Embodiment 1 shows a lower $J_{dk}$ variation rate than in Comparative example 1B and Comparative example 1C.

TABLE 2

| | $J_{dk}$ (−3.0 V) | $J_{dk}$ variation rate (%) | EQE variation rate (%) |
|---|---|---|---|
| Embodiment 1 | 2.0 | 5.0 | 2.0 |
| Comparative example 1A | 4.4 | 6.0 | 3.0 |
| Comparative example 1B | 2.5 | 55.0 | 3.0 |
| Comparative example 1C | 3.9 | 50.0 | 3.0 |
| Embodiment 2 | 1.9 | 4.5 | 2.0 |
| Comparative example 2 | 2.5 | 45.0 | 3.0 |

In addition, a sample (sample-A) obtained by forming the first organic material layer (hole injection blocking layer) 14 on a quartz substrate and a sample (sample-B) obtained by forming the second organic material layer 15 and the first organic material layer (hole injection blocking layer) 14 on a quartz substrate were produced. Then, they underwent thermal processing at the temperature of 160° C. in the atmosphere for 210 minutes. As a result, in the sample-A, the phenomenon that naphthalene-1,4,5,8-tetra carboxylic acid diimide was precipitated as a single crystal was recognized. On the other hand, no change was recognized in the sample-B. From this result, it is ascertained that the stacked film of the second organic material layer 15 and the first organic material layer (hole injection blocking layer) 14 is more excellent in heat resistance than the single layer of the first organic material layer (hole injection blocking layer) 14. That is, it is ascertained that the second organic material layer 15 functions as a cohesion suppressing layer.

In the imaging element or the photoelectric conversion element of Embodiment 1, since the first organic material layer and the second organic material layer are formed between the first electrode and the organic photoelectric conversion layer from the first electrode side, it is possible to prevent undesired injection of charge (specifically, injection of holes) from the organic photoelectric conversion layer to the first electrode by the first organic material layer, and as a result, a low dark current value can be achieved. Since the second organic material layer is formed between the first organic material layer and the organic photoelectric conversion layer, stability of the first organic material layer can be improved, and as a result, a small change in the dark current value over time can be achieved.

An imaging element similar to that of Embodiment 1 was produced using a material having a naphthalene diimide (NDI) structure expressed by the following structural formula (3) or structural formula (4), instead of the material shown in the above-described structural formula (1), and as a result, the results equivalent to those of the imaging element of Embodiment 1 could be obtained.

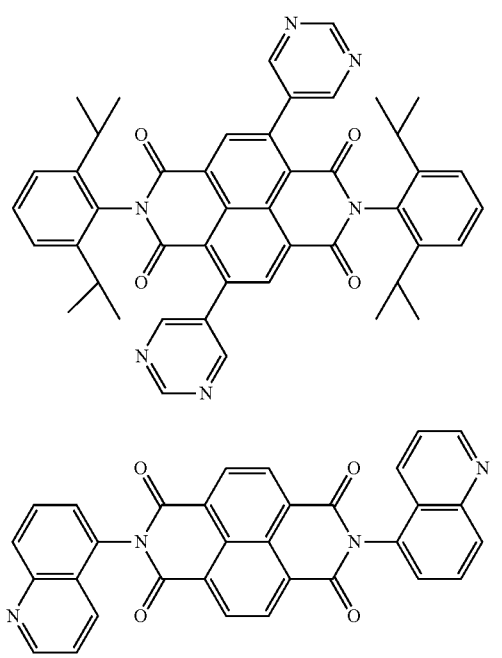

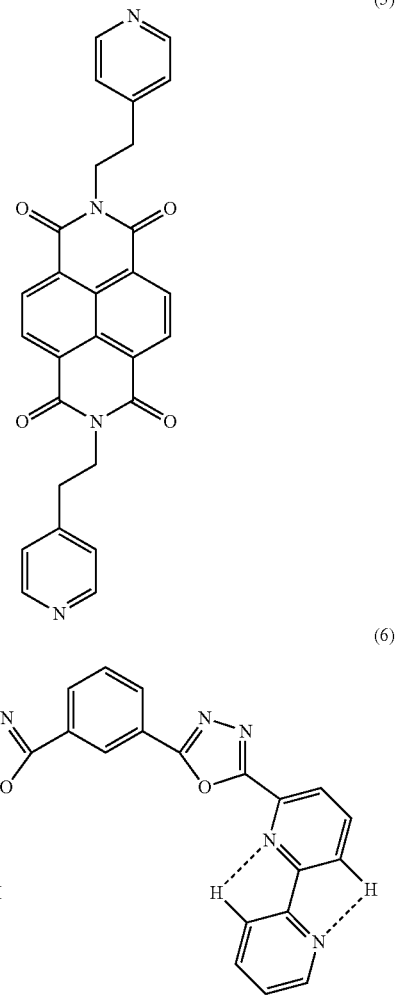

Embodiment 2

Embodiment 2 is a modification of Embodiment 1. In Embodiment 2, the first organic material layer 14 was formed of a material expressed by the following structural formula (5), which is pyridylethyl naphthalene imide, specifically, N,N'-bis[2-(4-pyridyl)ethyl]naphthalene-1,8:4,5-bis(dicarbimide), the second organic material layer 15 was formed of a material expressed by the following structural formula (6), which is 1,3-bis[2-(2,2'-bipyridine-6-yl)-1,3,4-oxadiazo-5-yl]benzene (BpyOXD). Other configuration and structure of the imaging element (photoelectric conversion element) of Embodiment 2 were set to be similar to those of Embodiment 1. In addition, an imaging element without the second organic material layer 15 formed therein was produced as Comparative example 2. Although the results of the dark current pressure resistance performance evaluation are shown in the table 2, Embodiment 2 shows a lower $J_{dk}$ variation rate than that of Comparative example 2.

Embodiment 3

Embodiment 3 is a modification of Embodiment 1 to Embodiment 2, and furthermore relates to a stacked-type imaging element of the present disclosure and a solid-state imaging apparatus according to a second aspect of the present disclosure.

Figure 2:
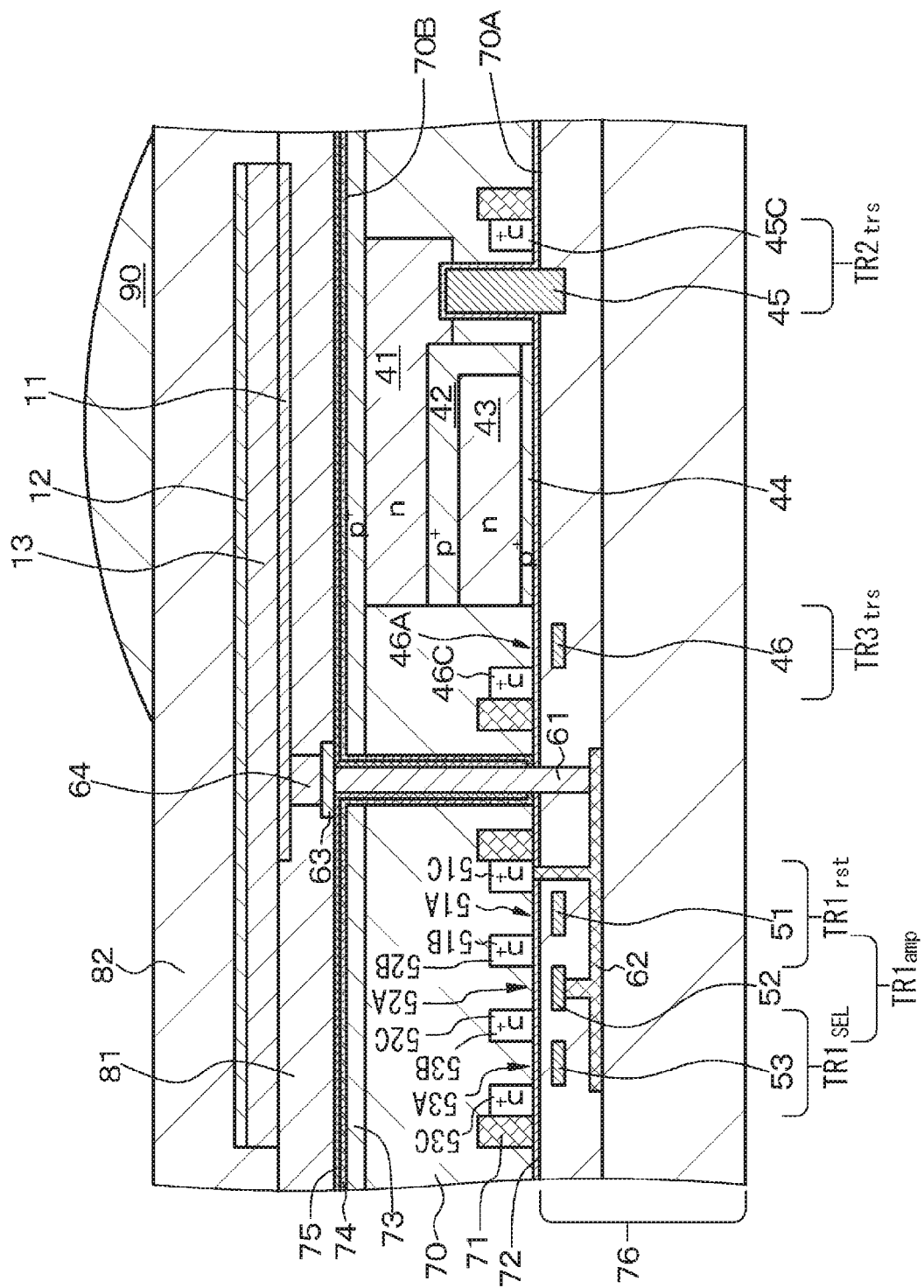
FIG. 2 is a schematic partial sectional view of an imaging element and a stacked-type imaging element of Embodiment 3.
Figure 3:
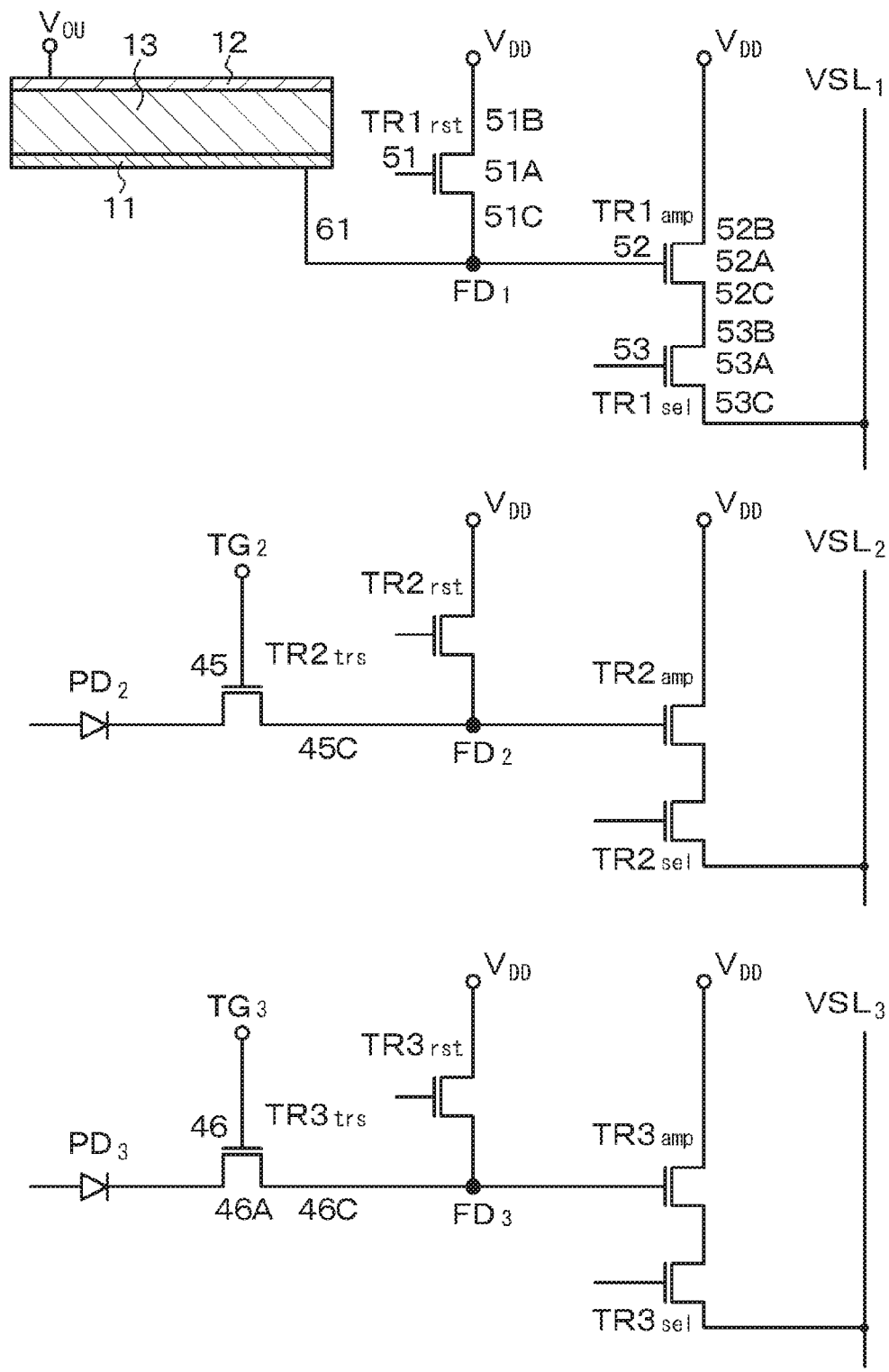
FIG. 3 is an equivalent circuit diagram of the imaging element and the stacked-type imaging element of Embodiment 3.
Figure 4:
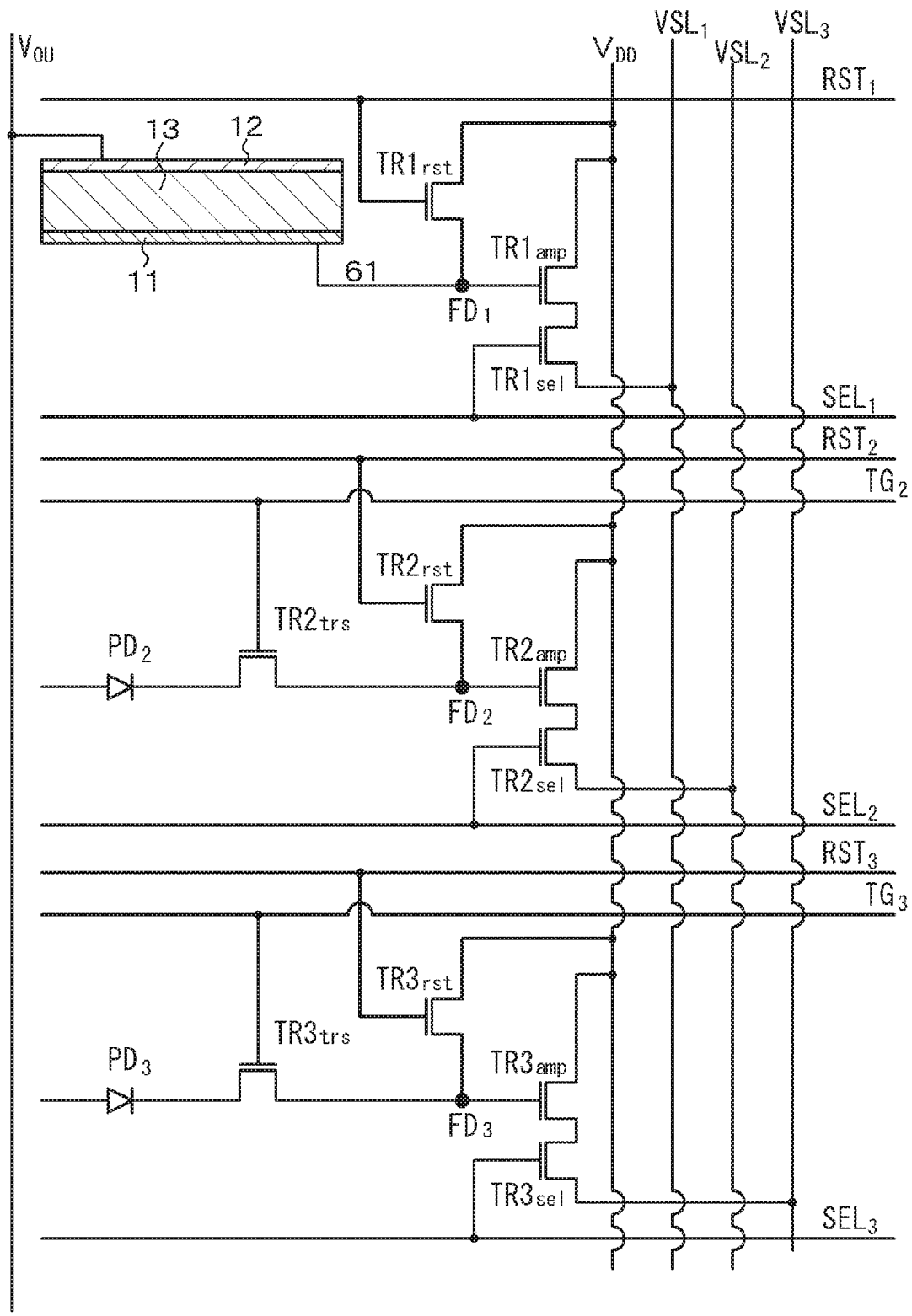
FIG. 4 is an equivalent circuit diagram of the imaging element and the stacked-type imaging element of Embodiment 3.
Figure 5:
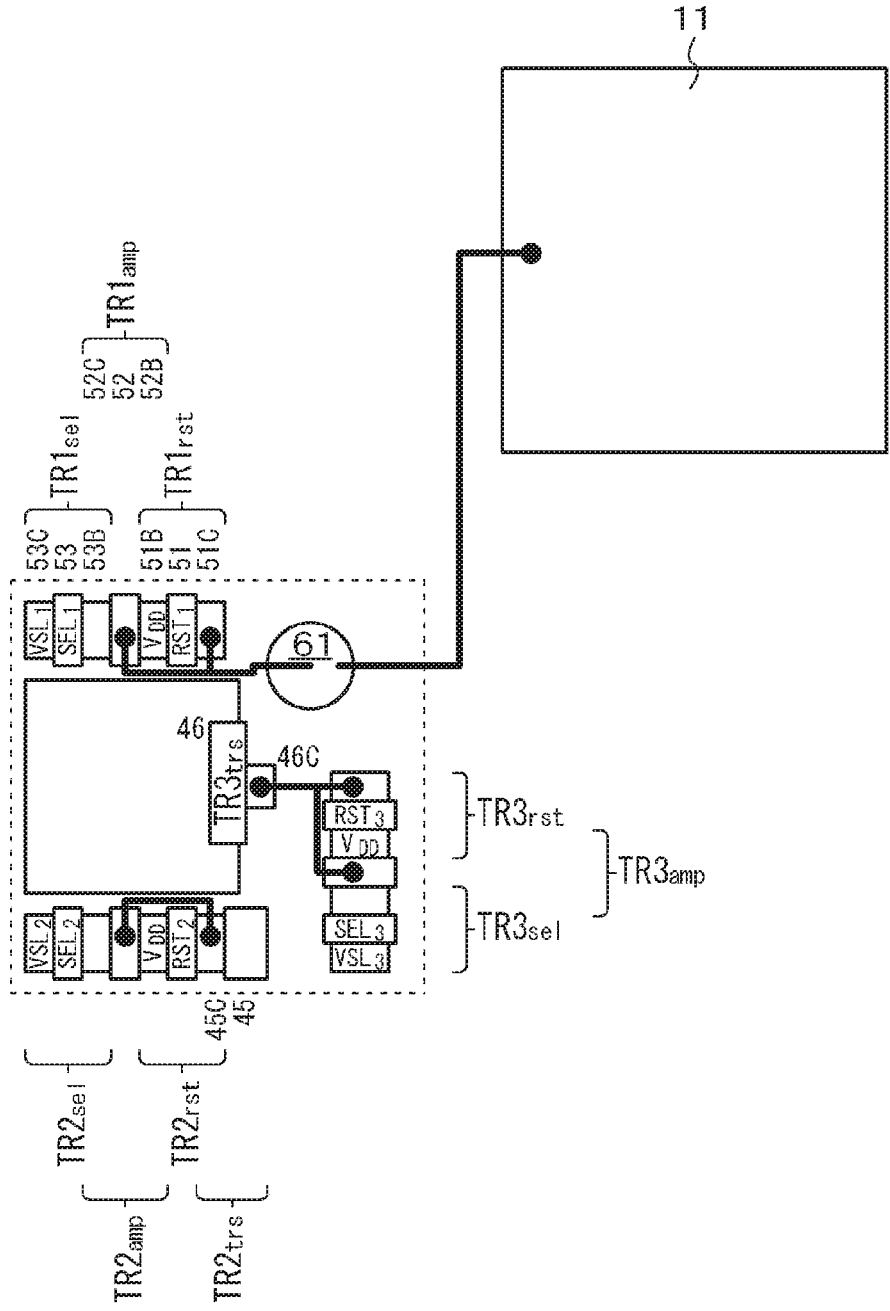
FIG. 5 is a schematic arrangement view of a first electrode forming the imaging element of Embodiment 3 and a transistor forming a control unit.
Figure 6:
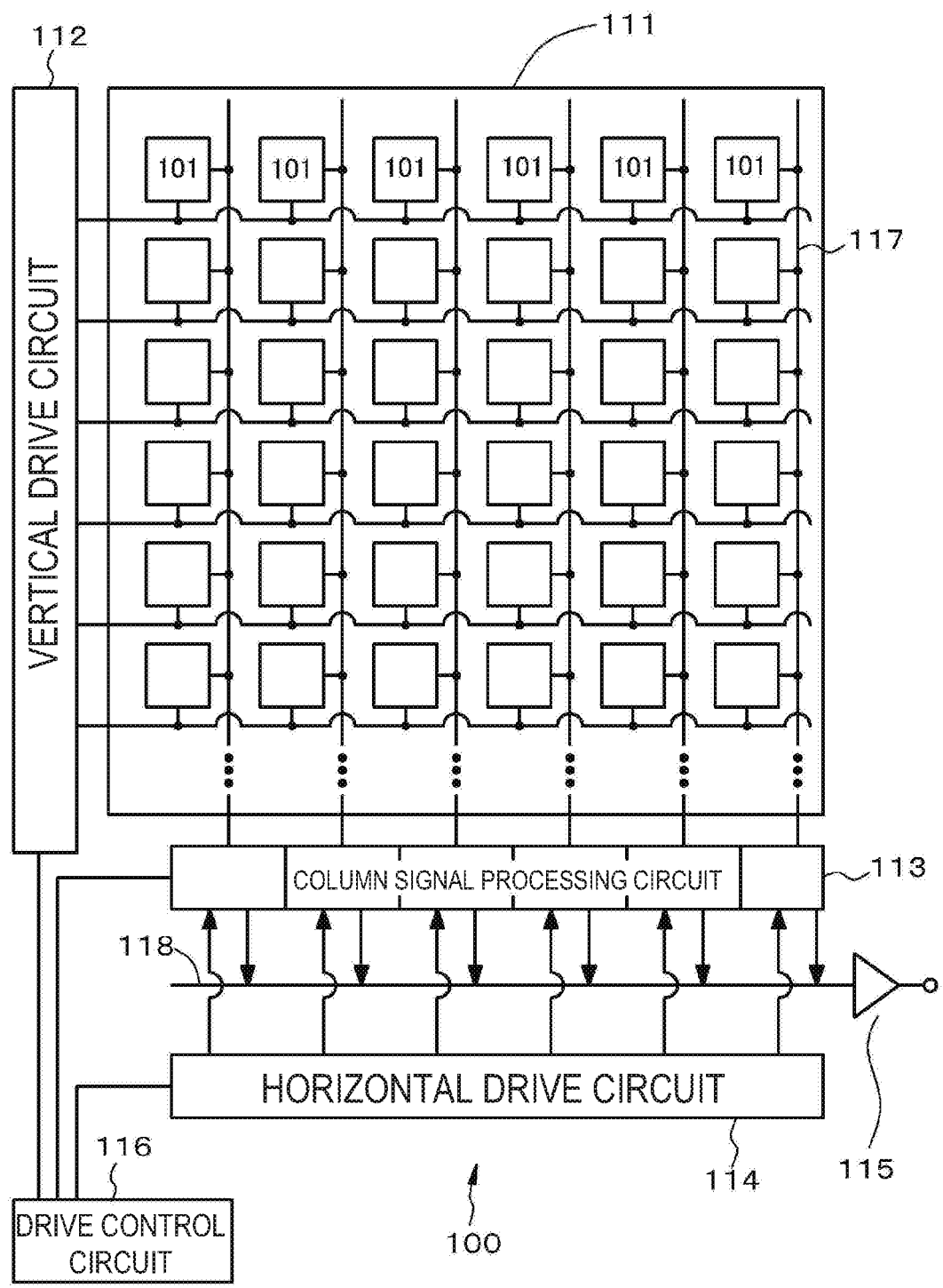
FIG. 6 is a conceptual diagram of a solid-state imaging apparatus of Embodiment 3.

FIG. 2 is a schematic partial sectional view of an imaging element and a stacked-type imaging element of Embodiment 3. FIGS. 3 and 4 are equivalent circuit diagrams of the imaging element and the stacked-type imaging element of Embodiment 3. FIG. 5 is a schematic arrangement view of a first electrode forming the imaging element of Embodiment 3 and a transistor forming a control unit. FIG. 6 is a conceptual diagram of a solid-state imaging apparatus of Embodiment 3.

The imaging element (which is a photoelectric conversion element, and specifically, for example, an imaging element for green) of Embodiment 3 includes a photoelectric conversion unit formed in a stacked structure of the first electrode 11, the organic photoelectric conversion layer 13, and the second electrode 12. The first organic material layer and the second organic material layer are formed between the first electrode 11 and the organic photoelectric conversion layer 13 from the first electrode side, and an electron injection blocking layer is formed between the organic photoelectric conversion layer 13 and the second electrode 12; however illustration of the first organic material layer, the second organic material layer, and the electron injection blocking layer is omitted, and only one layer which is the organic photoelectric conversion layer 13 is illustrated in the drawing. Specific materials forming the first organic material layer, the second organic material layer, the organic photoelectric conversion layer, and the electron injection blocking layer are as described in Embodiment 1 to Embodiment 2.

In addition, the stacked-type imaging element of Embodiment 3 includes at least one imaging element of Embodiment 1 to Embodiment 3. Moreover, the solid-state imaging apparatus of Embodiment 3 includes the plurality of stacked-type imaging elements of Embodiment 3.

In the imaging element of Embodiment 3, a control unit which is provided on the semiconductor substrate (more specifically, a silicon semiconductor layer) 70 and to which the first electrode 11 is connected is further included, and the photoelectric conversion unit is disposed above the semiconductor substrate 70. Here, the light incidence surface of the semiconductor substrate 70 is defined as an above side, and the opposite side of the semiconductor substrate 70 is defined as a below side. A wiring layer 62 formed of a plurality of wirings is disposed below the semiconductor substrate 70. Furthermore, the semiconductor substrate 70 further includes at least a charge storage portion (a floating diffusion layer $FD_1$) and an amplification transistor $TR1_{amp}$ forming the control unit, and the first electrode 11 is connected to the gate section of the floating diffusion layer $FD_1$ and the amplification transistor $TR1_{amp}$. The charge storage portion (the floating diffusion layer $FD_1$) stores the charges generated in the organic photoelectric conversion layer 13. The semiconductor substrate 70 further includes a reset transistor $TR1_{rst}$ and select transistor $TR1_{sel}$ forming the control unit. Furthermore, the floating diffusion layer $FD_1$ is connected to a source/drain region of one side of the reset transistor $TR1_{rst}$, and a source/drain region of one side of the amplification transistor $TR1_{amp}$ is connected to a source/drain region of one side of the select transistor $TR1_{sel}$, and a source/drain region of another side of the select transistor $TR1_{sel}$ is connected to the signal line $VSL_1$.

Specifically, the imaging element and stacked-type imaging element of Embodiment 3 are back surface illuminated type imaging element and stacked-type imaging element, and have a structure in which a first-type green imaging element of Embodiment 3 (hereinafter, referred to as "first imaging element") having a first-type green organic photoelectric conversion layer which absorbs green light and having sensitivity to green, a second-type conventional blue imaging element (hereinafter, referred to as "second imaging element") having a second-type photoelectric conversion layer which absorbs blue light and having sensitivity to blue, and a second-type conventional red imaging element (hereinafter, referred to as "third imaging element") having a second-type photoelectric conversion layer which absorbs red light and having sensitivity to red are stacked. Here, the red imaging element (third imaging element) and the blue imaging element (second imaging element) are provided in the semiconductor substrate 70, and the second imaging element is located more closer to the light incident side as compared to the third imaging element. Furthermore, the green imaging element (first imaging element) is provided above the blue imaging element (second imaging element). One pixel is formed by the stacked structure of the first imaging element, the second imaging element, and the third imaging element. No on-chip color filter is provided.

In the first imaging element, the first electrode 11 is formed on an interlayer insulating layer 81. The first organic material layer (hole injection blocking layer), the second organic material layer, the organic photoelectric conversion layer 13, and the electron injection blocking layer are formed on the first electrode 11, and the second electrode 12 is formed on the electron injection blocking layer. A protective layer 82 is formed on the entire surface including the second electrode 12 and an on-chip microlens 90 is provided on the protective layer 82. The first electrode 11 and the second electrode 12 are configured as, for example, transparent electrodes formed of ITO. The interlayer insulating layer 81 and the protective layer 82 are formed of a known insulating material (for example, $SiO_2$ or SiN).

An element separation region 71 is formed on the side of the first surface (front surface) 70A of the semiconductor substrate 70, and an oxide film 72 is formed on the first surface 70A of the semiconductor substrate 70. Moreover, a reset transistor $TR1_{rst}$, an amplification transistor $TR1_{amp}$ and select transistor $TR1_{sel}$ forming the control unit of the first imaging element are provided on the side of the first surface of the semiconductor substrate 70, and a first floating diffusion layer $FD_1$ is further provided.

The reset transistor $TR1_{rst}$ is formed of a gate section 51, a channel forming region 51A and source/drain regions 51B and 51C. The gate section 51 of the reset transistor $TR1_{rst}$ is connected to the reset line $RST_1$, and the source/drain region 51C of one side of the reset transistor $TR1_{rst}$ also functions as the first floating diffusion layer $FD_1$, and the source/drain region 51B of another side is connected to the power supply $V_{DD}$.

The first electrode 11 is connected to a source/drain region 51C (first floating diffusion layer $FD_1$) of one side of the reset transistor $TR1_{rst}$ via a connection hole 64 and a pad portion 63 provided in the interlayer insulating layer 81, a contact hole portion 61 formed in the semiconductor substrate 70 and the interlayer insulating layer 76, and the wiring layer 62 formed in the interlayer insulating layer 76.

The amplification transistor $TR1_{amp}$ is formed of the gate section 52, the channel forming region 52A and the source/drain regions 52B and 52C. The gate section 52 is connected to the first electrode 11 and the source/drain region 51C (first floating diffusion layer $FD_1$) of one side of the reset transistor $TR1_{rst}$ through the wiring layer 62. Furthermore, the source/drain region 52B of one side shares a region with the source/drain region 51B of another side forming the reset transistor $TR1_{rst}$, and is connected to power supply $V_{DD}$.

The select transistor $TR1_{sel}$ is formed of the gate section 53, the channel forming region 53A and the source/drain regions 53B and 53C. The gate section 53 is connected to the select line $SEL_1$. Furthermore, the source/drain region 53B of one side shares a region with the source/drain region 52C of another side forming the amplification transistor $TR1_{amp}$, and the source/drain region 53C is connected to the signal line (data output line) $VSL_1$ 117.

The second imaging element includes an n-type semiconductor region 41 provided in the semiconductor substrate 70 as a photoelectric conversion layer. The gate section 45 of the transfer transistor $TR2_{trs}$ formed of the vertical transistor extends to the n-type semiconductor region 41 and is connected to the transfer gate line $TG_2$. Furthermore, a second floating diffusion layer $FD_2$ is provided in a region 45C of the semiconductor substrate 70 near the gate section 45 of the transfer transistor $TR2_{trs}$. Charges stored in the n-type semiconductor region 41 are read out to the second floating diffusion layer $FD_2$ via a transfer channel formed along the gate section 45.

In the second imaging element, the reset transistor $TR2_{trs}$, the amplification transistor $TR2_{amp}$ p and the select transistor $TR2_{sel}$ forming the control unit of the second imaging element are further provided on the first surface side of the semiconductor substrate 70.

The reset transistor $TR2_{trs}$ is formed of the gate section, the channel forming region and the source/drain region. The gate section of the reset transistor $TR2_{trs}$ is connected to the reset line $RST_2$, and a source/drain region of one side of the reset transistor $TR2_{trs}$ is connected to the power supply $V_{DD}$, and a source/drain region of another side also functions as a second a floating diffusion layer $FD_2$.

The amplification transistor $TR2_{amp}$ is formed of the gate section, the channel forming region and the source/drain region. The gate section is connected to a source/drain region (second floating diffusion layer $FD_2$) of another side of the reset transistor $TR2_{trs}$. Furthermore, a source/drain region of one side shares a region with a source/drain region of one side forming the reset transistor $TR2_{trs}$, and is connected to the power supply $V_{DD}$.

The select transistor $TR2_{sel}$ is formed of the gate section, the channel forming region and the source/drain region. The gate section is connected to the select line $SEL_2$. Furthermore, a source/drain region of one side shares a region with a source/drain region of another side forming the amplification transistor $TR2_{amp}$, and a source/drain region of another side is connected to the signal line (data output line) $VSL_2$.

The third imaging element has an n-type semiconductor region 43 provided in the semiconductor substrate 70 as a photoelectric conversion layer. The gate section 46 of the transfer transistor $TR3_{trs}$ is connected to the transfer gate line $TG_3$. Furthermore, a third floating diffusion layer $FD_3$ is provided in a region 46C of the semiconductor substrate 70 near the gate section 46 of the transfer transistor $TR3_{trs}$. Charges stored in the n-type semiconductor region 43 are read out to the third floating diffusion layer $FD_3$ via a transfer channel 46A formed along the gate section 46.

In the third imaging element, the reset transistor $TR3_{rst}$, the amplification transistor $TR3_{amp}$ and the select transistor $TR3_{SEL}$ forming the control unit of the third imaging element are further provided on the first surface side of the semiconductor substrate 70.

The reset transistor $TR3_{rst}$ is formed of the gate section, the channel forming region and the source/drain region. The gate section of the reset transistor $TR3_{rst}$ is connected to the reset line $RST_3$, and a source/drain region of one side of the reset transistor $TR3_{rst}$ is connected to the power supply $V_{DD}$, and a source/drain region of another side also functions as the third floating diffusion layer $FD_3$.

The amplification transistor $TR3_{amp}$ is formed of the gate section, the channel forming region and the source/drain region. The gate section is connected to the source/drain region (third floating diffusion layer $FD_3$) of another side of the reset transistor $TR3_{rst}$. Furthermore, a source/drain region of one side shares a region with a source/drain region of one side forming the reset transistor $TR3_{rst}$, and is connected to the power supply $V_{DD}$.

The select transistor $TR3_{SEL}$ is formed of the gate section, the channel forming region and the source/drain region. The gate section is connected to the select line $SEL_3$. Furthermore, a source/drain region of one side shares a region with a source/drain region of another side forming the amplification transistor $TR3_{amp}$, and a source/drain region of another side is connected to the signal line (data output line) $VSL_3$.

Reset lines $RST_1$, $RST_2$ and $RST_3$, select lines $SEL_1$, $SEL_2$ and $SEL_3$, and transfer gate lines $TG_2$ and $TG_3$ are connected to the vertical drive circuit 112 forming the drive circuit, and signal lines (data output lines) $VSL_1$, $VSL_2$ and $VSL_3$ are connected to a column signal processing circuit 113 forming the drive circuit.

A $p^+$ layer 44 is provided between the n-type semiconductor region 43 and the surface 70A of the semiconductor substrate 70 to suppress generation of dark current. A $p^+$ layer 42 is formed between the n-type semiconductor region 41 and the n-type semiconductor region 43, and a part of the side surface of the n-type semiconductor region 43 is surrounded by the $p^+$ layer 42. A $p^+$ layer 73 is formed on the side of the back surface 70B of the semiconductor substrate 70, and an $HfO_2$ film 74 and an insulating film 75 are formed in a portion of the semiconductor substrate 70 where the contact hole portion 61 is to be formed from the $p^+$ layer 73. In the interlayer insulating layer 76, wirings are formed over a plurality of layers, but are omitted from illustration.

The $HfO_2$ film 74 is a film having a negative fixed charge, and generation of dark current can be suppressed by providing such a film. Further, instead of the $HfO_2$ film, an aluminum oxide ($Al_2O_3$) film, a zirconium oxide ($ZrO_2$) film, a tantalum oxide ($Ta_2O_5$) film, a titanium oxide ($TiO_2$) film, a lanthanum oxide ($La_2O_3$) film, a praseodymium oxide ($Pr_2O_3$) film, a cerium oxide ($CeO_2$) film, a neodymium oxide ($Nd_2O_3$) film, a promethium oxide ($Pm_2O_3$) film, a samarium oxide ($Sm_2O_3$) film, a europium oxide ($Eu_2O_3$) film, a gadolinium oxide ($Gd_2O_3$) film, a terbium oxide ($TB_{203}$) film, a dysprosium oxide ($Dy_2O_3$) film, a holmium oxide ($Ho_2O_3$) film, a thulium oxide ($Tm_2O_3$) film, a ytterbium oxide ($YB_2O_3$) film, a lutetium oxide ($Lu_2O_3$) film, a yttrium oxide ($Y_2O_3$) film, a hafnium nitride film, an aluminum nitride film, a hafnium oxynitride film and an aluminum oxynitride film may be used. Examples of the film forming method of these films include a CVD method, a PVD method and an ALD method.

Hereinafter, the operation of the imaging element (first imaging element), of Embodiment 1 will be described. Here, the potential of the first electrode 11 is higher than the potential of the second electrode. That is, for example, the first electrode 11 is set to a positive potential and the second electrode is set to a negative potential, and photoelectric conversion is performed in the organic photoelectric conversion layer 13, and electrons are read out to the floating diffusion layer. This also applies to other embodiments. Further, in a mode in which the first electrode 11 is set to a negative potential and the second electrode is set to a positive potential and holes generated based on photoelectric conversion in the organic photoelectric conversion layer 13 are read out to the floating diffusion layer, it is only necessary to invert the height of the potential described below. However, in this case, the second electrode 12 is formed above the interlayer insulating layer 81, the electron injection blocking layer, the organic photoelectric conversion layer, the second organic material layer, and the first organic material layer (hole injection blocking layer) are formed on the second electrode 12, and the first electrode 11 is formed on the first organic material layer (hole injection blocking layer). In addition, in various explanations, the first electrode may be replaced with the second electrode if necessary.

First, a reset operation is performed. Thus, the potential of the first floating diffusion layer $FD_1$ is reset and the potential of the first floating diffusion layer $FD_1$ becomes the potential $V_{DD}$ of the power supply. Then, during a subsequent charge storage and charge reading period, photoelectric conversion occurs in the organic photoelectric conversion layer 13 by light incident on the organic photoelectric conversion layer 13. Here, a voltage is applied from the drive circuit to the first electrode 11 and the second electrode 12. The holes generated by the photoelectric conversion are sent from the second electrode 12 to the drive circuit via a wiring $V_{OU}$. On the other hand, since the potential of the first electrode 11 is set to be higher than the potential of the second electrode 12, that is, for example, a positive potential is applied to the first electrode 11 and a negative potential is applied to the second electrode 12, electrons generated by the photoelectric conversion are read to the first floating diffusion layer $FD_1$ via the first electrode 11. That is, the charges generated in the organic photoelectric conversion layer 13 are read to the control unit. As described, the series of operations, the reset operation, the charge storage, and the charge transfer are completed.

The operation of the amplification transistor $TR1_{amp}$ and the select transistor $TR1_{sel}$ after the electrons are read out to the first floating diffusion layer $FD_1$ are the same as that of the conventional transistors. A series of operations such as charge storage, reset operation, and charge transfer of the second imaging element and the third imaging element are the same as a series of conventional operations such as charge storage, reset operation, and charge transfer. Furthermore, the reset noise of the first floating diffusion layer $FD_1$ can be removed by a correlated double sampling (CDS) process as in the related art.

FIG. 6 shows a conceptual diagram of a solid-state imaging apparatus of Embodiment 3. The solid-state imaging apparatus 100 of Embodiment 3 is formed of an imaging area 111 in which the stacked-type imaging elements 101 are arranged in a two-dimensional array, a vertical drive circuit 112 as a drive circuit (peripheral circuit), a column signal processing circuit 113, a horizontal drive circuit 114, an output circuit 115, a drive control circuit 116, etc. These circuits may be formed by well-known circuits, and moreover, may be formed by using other circuit configurations (e.g., various circuits used in a conventional CCD-type solid imaging apparatus or CMOS-type solid imaging apparatus). Further, in FIG. 6, the reference number "101" of the stacked-type imaging element 101 is only shown in one row.

The drive control circuit 116 generates a clock signal and a control signal which are the basis of the operations of the vertical drive circuit 112, the column signal processing circuit 113, and the horizontal drive circuit 114 based on a vertical synchronization signal, a horizontal synchronization signal, and a master clock. Further, the generated clock signal and control signal are input to the vertical drive circuit 112, the column signal processing circuit 113, and the horizontal drive circuit 114.

The vertical drive circuit 112 is formed of, for example, a shift register, and selectively scans each stacked-type imaging element 101 in the imaging area 111 in the vertical direction in units of rows. Further, a pixel signal (image signal) based on the current (signal) generated according to the amount of light received by each stacked-type imaging element 101 is sent to the column signal processing circuit 113 via the signal lines (data output lines) 117, VSL.

For example, the column signal processing circuit 113 is arranged for each column of the stacked-type imaging element 101, and signal processing for noise removal and signal amplification is performed on image signal output from the stacked-type imaging element 101 for one row in each stacked-type imaging element 101 by a signal from a black reference pixel (not shown, but formed around the effective pixel area). A horizontal selection switch (not shown) is provided in the output stage of the column signal processing circuit 113 so as to be connected to the horizontal signal line 118.

The horizontal drive circuit 114 is formed of, for example, a shift register, and sequentially selects each of the column signal processing circuits 113 by sequentially outputting horizontal scanning pulses, and outputs signals from each of the column signal processing circuits 113 to the horizontal signal line 118.

The output circuit 115 is output by performing signal processing on the signals sequentially supplied from each of the column signal processing circuits 113 via the horizontal signal line 118.

Figure 7:
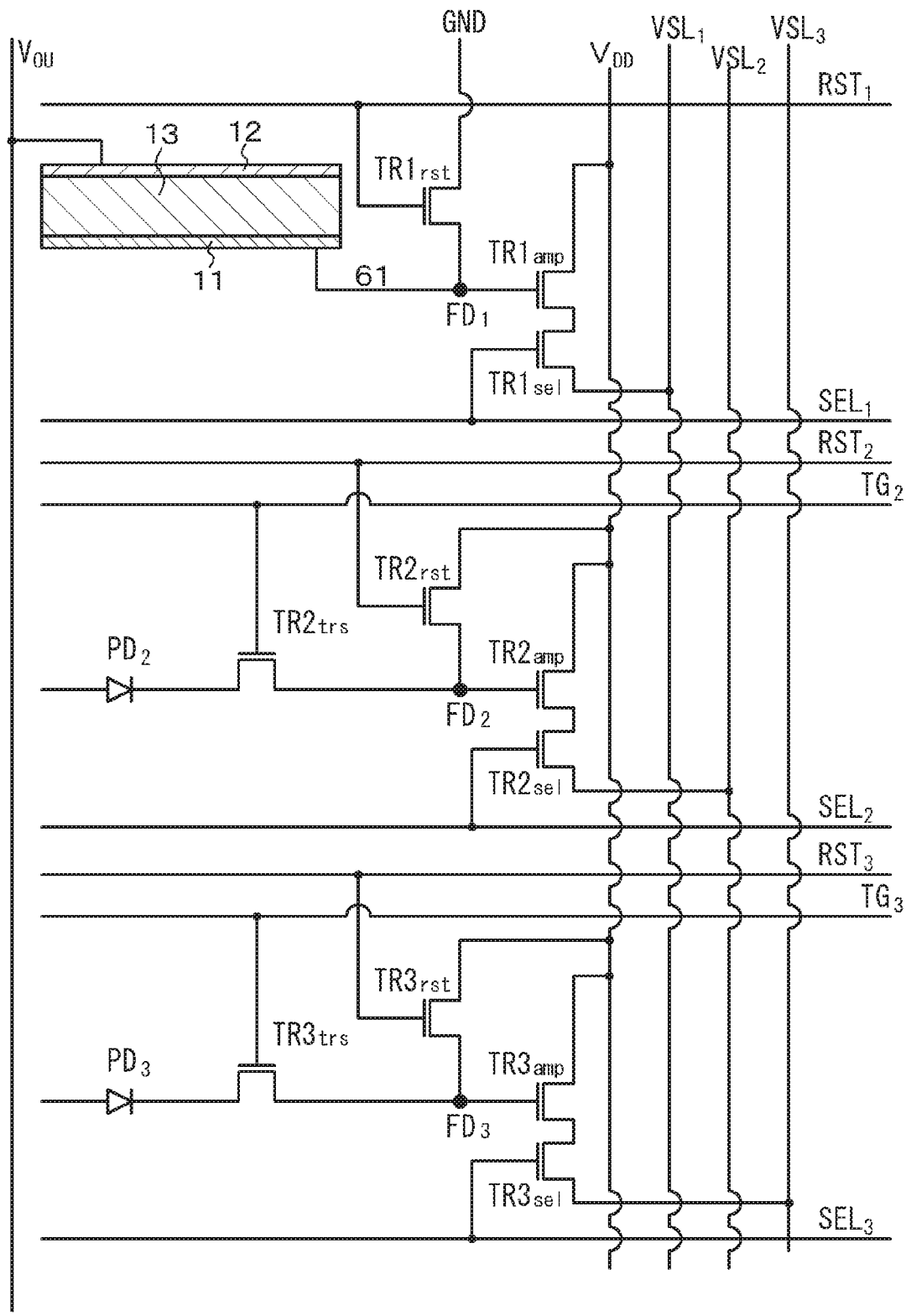
FIG. 7 is an equivalent circuit diagram of a modified example of the imaging element and the stacked-type imaging element of Embodiment 3.
Figure 8:
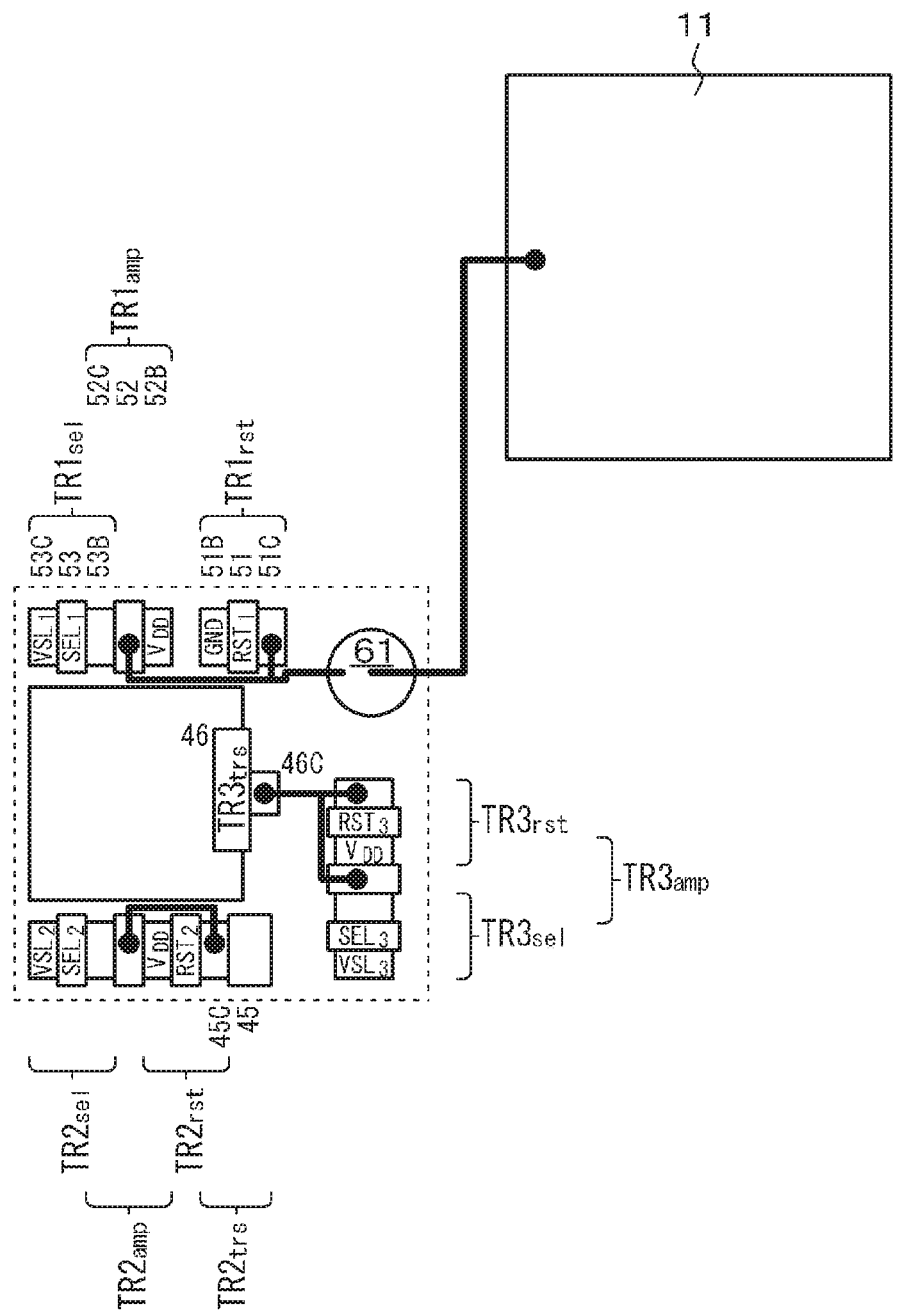
FIG. 8 is a schematic arrangement view of the first electrode forming the modified example of the imaging element of Embodiment 3 shown in FIG. 7, and a transistor forming a control unit.

As shown in FIG. 7 showing an equivalent circuit diagram of a modified example of the imaging element and stacked-type imaging element of Embodiment 3 and in FIG. 8 showing the schematic arrangement of the first electrode and the transistor forming the control unit forming a modified example of the imaging element according to Embodiment 3, and the source/drain region 51B of another side of the reset transistor $TR1_{rst}$ may be grounded instead of being connected to the power supply $V_{DD}$.

The imaging element and stacked-type imaging element of Embodiment 3 may be manufactured by, for example, the following method. That is, first, an SOI substrate is prepared. Then, a first silicon layer is formed on the surface of the SOI substrate by an epitaxial growth method, and a $p^+$ layer 73 and an n-type semiconductor region 41 are formed in the first silicon layer. Next, a second silicon layer is formed on the first silicon layer by an epitaxial growth method, and the element separation region 71, the oxide film 72, the $p^+$ layer 42, the n-type semiconductor region 43, and the $p^+$ layer 44 are formed on the second silicon layer. Furthermore, various transistors and the like forming the control unit of the imaging element are formed on the second silicon layer, and the wiring layer 62, an interlayer insulating layer 76, and various wirings are further formed thereon, and then the interlayer insulating layer 76 and the supporting substrate (not shown) are bonded to each other. Thereafter, the SOI substrate is removed to expose the first silicon layer. Further, the surface of the second silicon layer corresponds to the surface 70A of the semiconductor substrate 70, and the surface of the first silicon layer corresponds to the back surface 70B of the semiconductor substrate 70. Furthermore, the first silicon layer and the second silicon layer are collectively referred to as the semiconductor substrate 70. Next, an opening for forming the contact hole portion 61 is formed on the side of the back surface 70B of the semiconductor substrate 70, and the $HfO_2$ film 74, the insulating film 75 and the contact hole portion 61 are formed, and the pad portions 63, the interlayer insulating layer 81, the connection holes 64, and the first electrode 11 are further formed. Next, the organic photoelectric conversion layer 13 or the like is formed on the basis of a co-evaporation method, and further, the second electrode 12, the protective layer 82, and the on-chip microlens 90 are formed. Accordingly, the imaging element and the stacked-type imaging element of Embodiment 3 may be obtained.

For example, the phthalocyanine derivative has excellent spectral characteristics of green, but electron mobility which is an index indicating magnitude of electron transport properties is about $10^{-9}$ cm$^2$/V·s to about $10^{-6}$ cm$^2$/V·s in many cases. In addition, even in a case in which a material with high mobility is used as the optical absorption organic semiconductor material, high photoelectric conversion efficiency may not be obtained unless an appropriate heterojunction state is not realized between energy levels of the electron transport material and the hole transport material to be used. That is, in order obtain the organic photoelectric conversion layer with good characteristics, the energy junction, the transport properties (mobility), and the spectral characteristics have to be simultaneously in an optimum state.

In an imaging element of the related art, with regard to a material of the organic photoelectric conversion layer, two functions of carrier transport properties and spectral characteristics are requested to satisfy desired characteristics. On the other hand, in the imaging element of Embodiment 1 to Embodiment 3, functions of the carrier transport properties (the electron transport properties and the hole transport properties) and light absorption characteristics are allocated to other materials. That is, by configuring the organic photoelectric conversion layer that has the bulk heterostructure in which a plurality of types (specifically, a minimum of 3 types) of materials is mixed, it is possible to provide the imaging element in which the electric characteristics and the spectral characteristics are compatible. That is, it is possible to obtain the organic photoelectric conversion layer that has high efficiency and good spectral characteristics. Then, in this way, material design can be optimized for each function of the carrier transport characteristics and the spectral characteristics. Consequently, it is possible to achieve the degree of high material design freedom. Further, to configure each of a blue imaging element, a green imaging element, and a red imaging element, the same material may be used as the electron transport material and the hole transport material and only the optical absorption organic semiconductor material may be changed.

In general, in the organic photoelectric conversion layer, a film thickness for ensuring an optical absorption amount is decided depending on an absorption coefficient of a material to be used. In a case in which the organic photoelectric conversion layer is formed of only an optical absorption organic semiconductor material, the optical absorption coefficient of the organic photoelectric conversion layer tends to be high. Therefore, when the thickness of the organic photoelectric conversion layer is excessively thick, a wavelength with a wide range may be absorbed and spectral characteristics of a desired color may not be obtained. On the other hand, in the imaging element of Embodiment 1 to Embodiment 3, for example, the organic photoelectric conversion layer is formed of a mixture of the electron transport material that has no optical absorption peak with respect to the visible light (that is, the transparent electron transport material), the hole transport material that has no optical absorption peak with respect to the visible light (that is, the transparent hole transport material), and the optical absorption organic semiconductor material. Consequently, the optical absorption coefficient of the entire organic photoelectric conversion layer can be set to a low value, and it is easy to increase the thickness of the organic photoelectric conversion layer.

Therefore, the thickness of the organic photoelectric conversion layer can be thicker than in the imaging element of the related art, and thus it is possible to achieve low capacity of the organic photoelectric conversion layer. Thus, in an imaging element of a direct-connection type of floating diffusion layer (FD layer) (an imaging element that has a structure with no transfer gate portion), conversion efficiency can be improved. Here, the imaging element of the direct-connection type of floating diffusion layer in Embodiment 3 has a structure in which the organic photoelectric conversion layer is interposed between the first electrode and the second electrode, and a capacity in this structure has an influence on random noise characteristics or conversion efficiency. Therefore, in order to obtain more excellent imaging characteristics, it is necessary to decrease a capacity component of the organic photoelectric conversion layer. In the imaging element of Embodiment 3, as described above, since it is easy to increase the thickness of the organic photoelectric conversion layer in the state in which the organic photoelectric conversion layer has the excellent spectral characteristics, it is possible to obtain the good random noise characteristics or conversion efficiency.

As described above, in the imaging element (the photoelectric conversion element) of Embodiment 3, the organic photoelectric conversion layer is formed of the mixture of the electron transport material, the optical absorption organic semiconductor material, and the hole transport material. That is, the organic photoelectric conversion layer has the bulk heterostructure. Therefore, in order to form the organic photoelectric conversion layer of each of the blue imaging element, the green imaging element, and the red imaging element, the same material may be used in the electron transport material and the hole transport material and only the optical absorption organic semiconductor material may be changed. That is, the function of the material of the organic photoelectric conversion layer is separated. In addition, the imaging element of Embodiment 3 has a high S/N ratio. Further, it is possible to improve the photoelectric conversion efficiency with light irradiation and suppress deterioration in the optical response characteristics.

Embodiment 4

Figure 9:
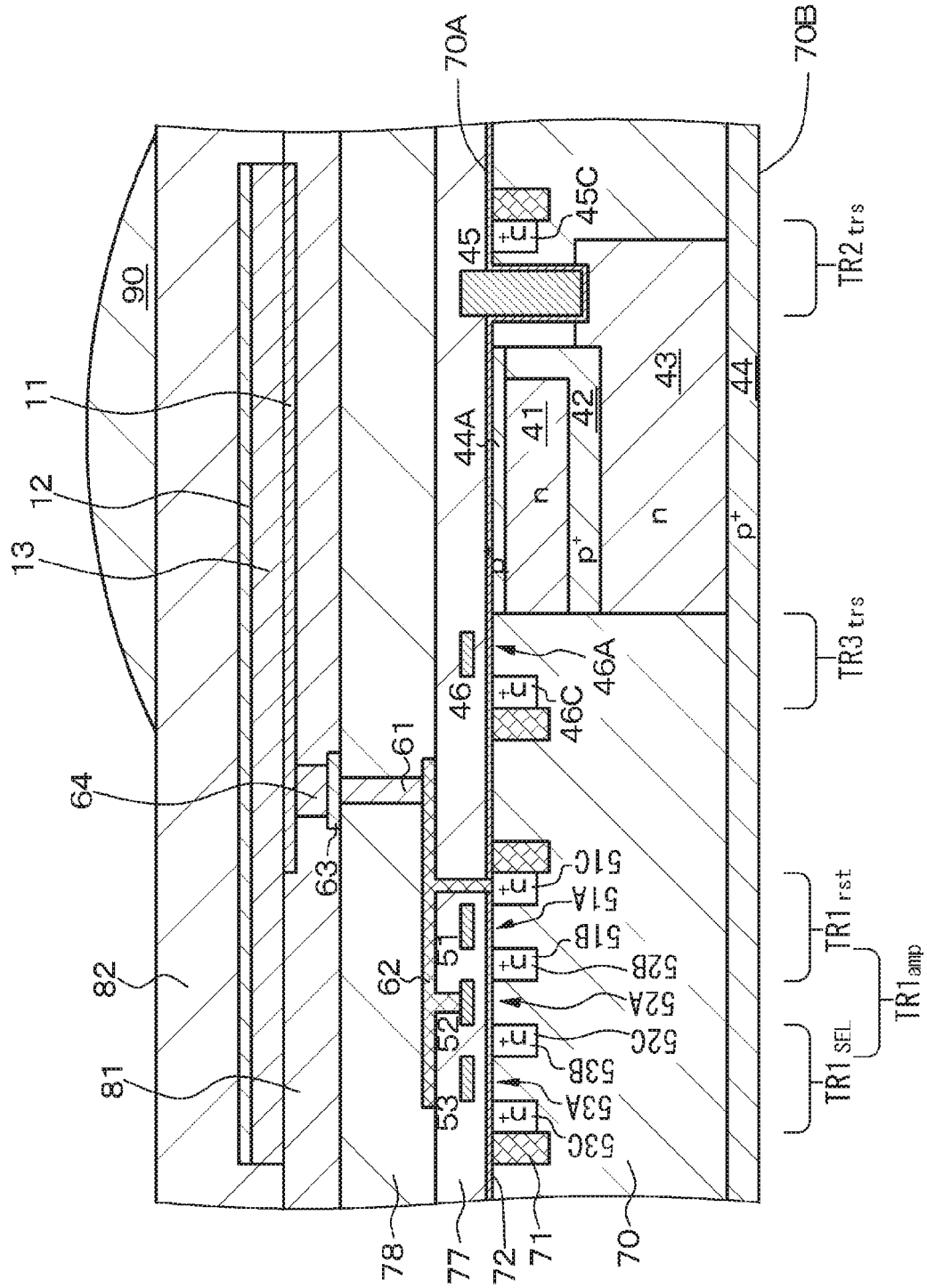
FIG. 9 is a schematic partial sectional view of an imaging element and stacked-type imaging element of Embodiment 4.

Embodiment 4 is a modification of Embodiment 3. The imaging element and stacked-type imaging element of Embodiment 4 schematically shown in FIG. 9 are front surface illuminated type imaging element and stacked-type imaging element, and have a structure in which a first-type green imaging element of Embodiment 3 (first imaging element) having a first-type green organic photoelectric conversion layer which absorbs green light and having sensitivity to green, a second-type conventional blue imaging element (second imaging element) having a second-type photoelectric conversion layer which absorbs blue light and having sensitivity to blue, and a second-type conventional red imaging element (third imaging element) having a second-type photoelectric conversion layer which absorbs red light and having sensitivity to red are stacked. Here, the red imaging element (third imaging element) and the blue imaging element (second imaging element) are provided in the semiconductor substrate 70, and the second imaging element is located more closer to the light incident side as compared to the third imaging element. Furthermore, the green imaging element (first imaging element) is provided above the blue imaging element (second imaging element).

Various transistors forming the control unit are provided on the surface 70A of the semiconductor substrate 70, as in Embodiment 3. These transistors may have the substantially same configuration and structure of transistors described in Embodiment 3. Furthermore, the second imaging element and the third imaging element are provided on the semiconductor substrate 70, and these imaging elements also may have the substantially same configuration and structure of the second imaging element and the third imaging element described in Embodiment 3.

The interlayer insulating layers 77 and 78 are formed on the surface 70 A of the semiconductor substrate 70, and the photoelectric conversion unit (first electrode 11, organic photoelectric conversion layer 13 or the like, and second electrode 12) and the like forming the imaging element of Embodiment 3 are formed on the interlayer insulating layer 78.

As described above, the configuration and structure of the imaging element and the stacked-type imaging element of Embodiment 4 are the same as those of the imaging element and the stacked-type imaging element of Example 3 except for being the front surface illuminated type imaging element and stacked-type imaging element, and thus detailed description will be omitted.

Embodiment 5

Embodiment 5 is a modification of Embodiment 3 and Embodiment 4.

Figure 10:
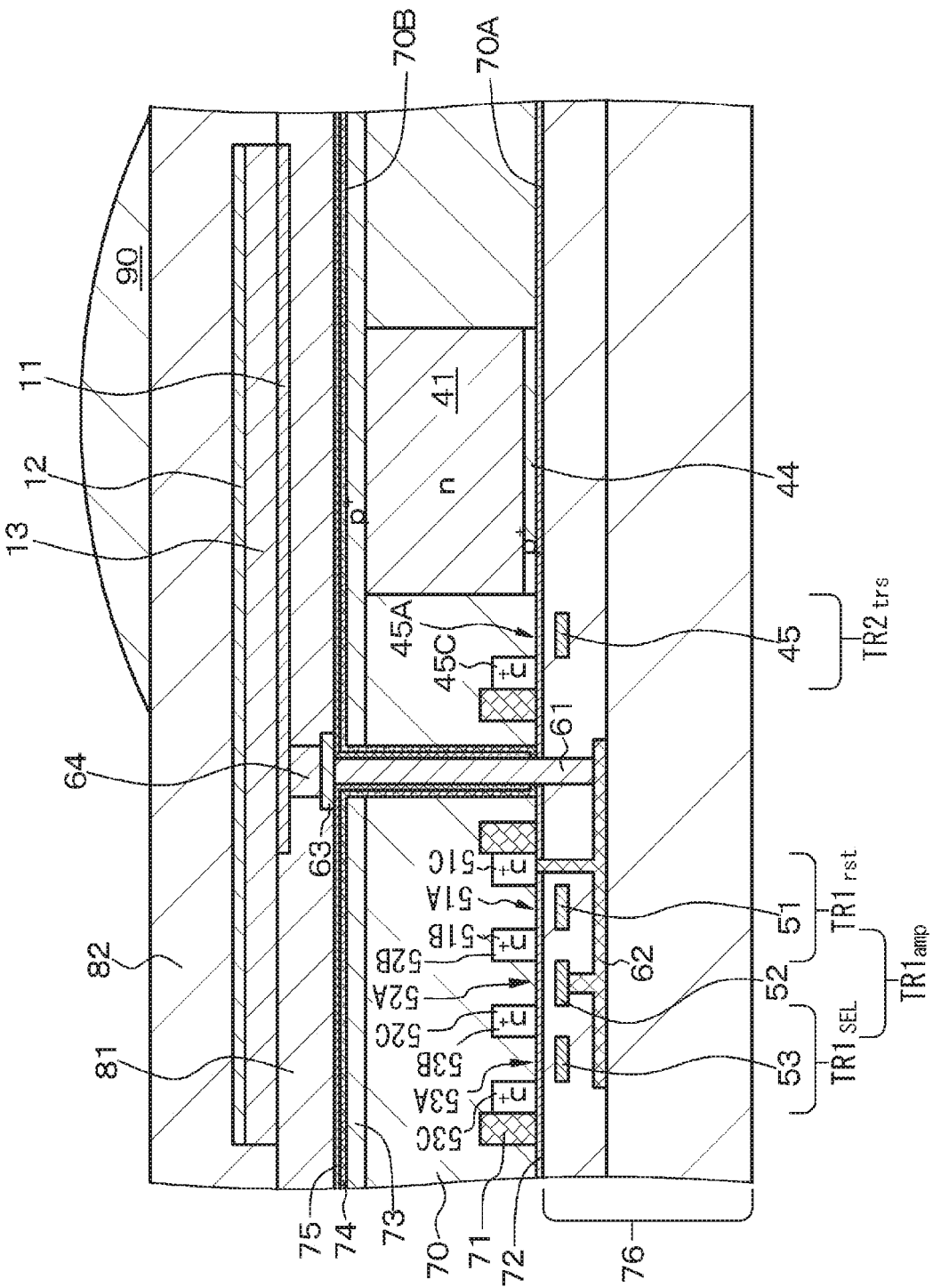
FIG. 10 is a schematic partial sectional view of an imaging element and stacked-type imaging element of Embodiment 5.
Figure 11:
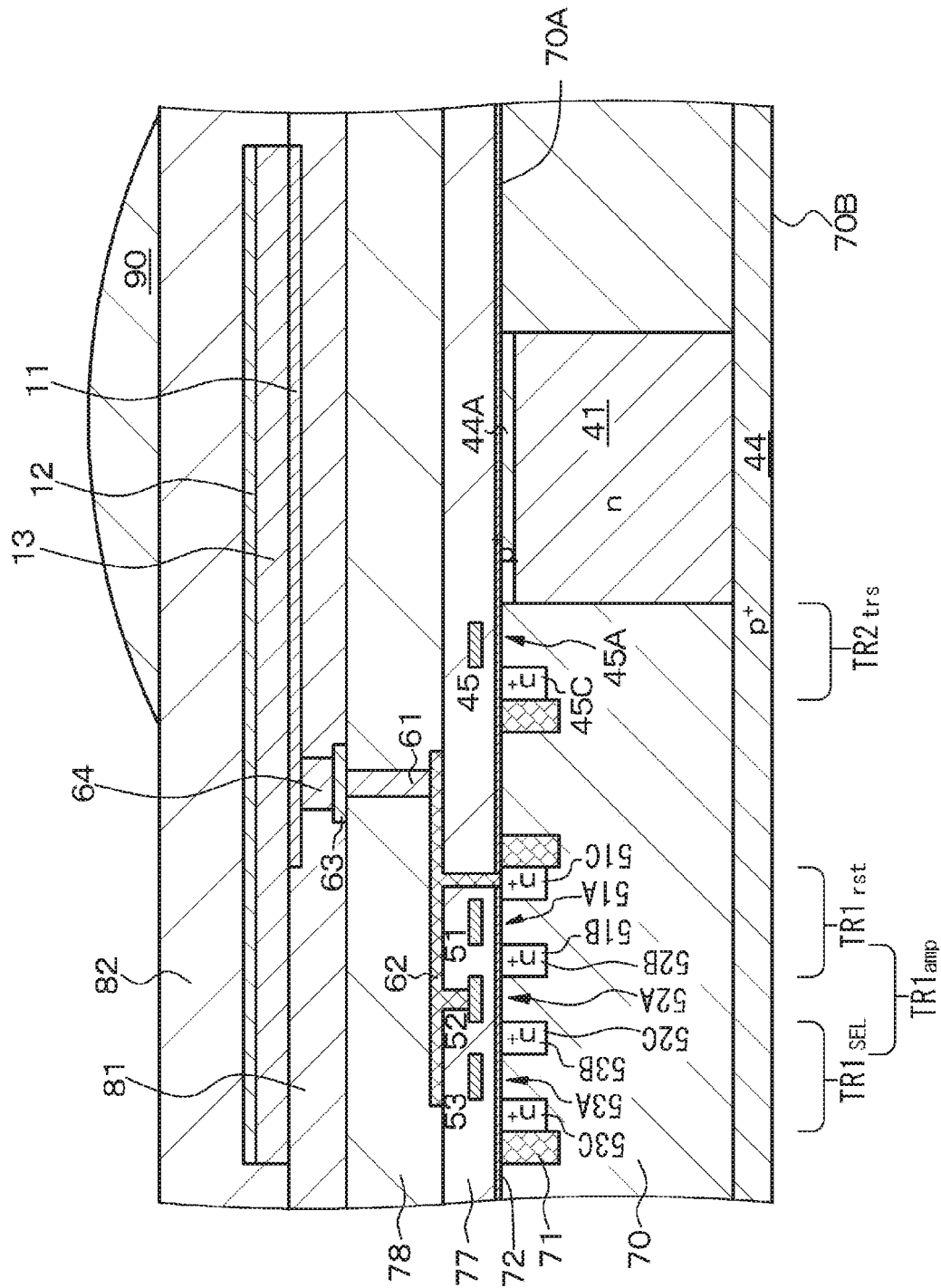
FIG. 11 is a schematic partial sectional view of a modified example of the imaging element and the stacked-type imaging element of Embodiment 5.

The imaging element and stacked-type imaging element of Embodiment 5 schematically shown in FIG. 10 are back surface illuminated type imaging element and stacked-type imaging element, and have a structure in which the first imaging element of the first type of Embodiment 3 and two second imaging elements of the second type are stacked. Further, modified examples of the imaging element of Embodiment 5 and stacked-type imaging element of which partial cross sectional views are shown in FIG. 11 are front surface illuminated type imaging element and stacked-type imaging element, and have a structure in which the first imaging element of the first type of Embodiment 3 and two second imaging elements of the second type are stacked. Here, the first imaging element absorbs primary color of light, and the second imaging element absorbs complementary color of light. Alternatively, the first imaging element absorbs white light and the second imaging element absorbs infrared light.

Figure 12:
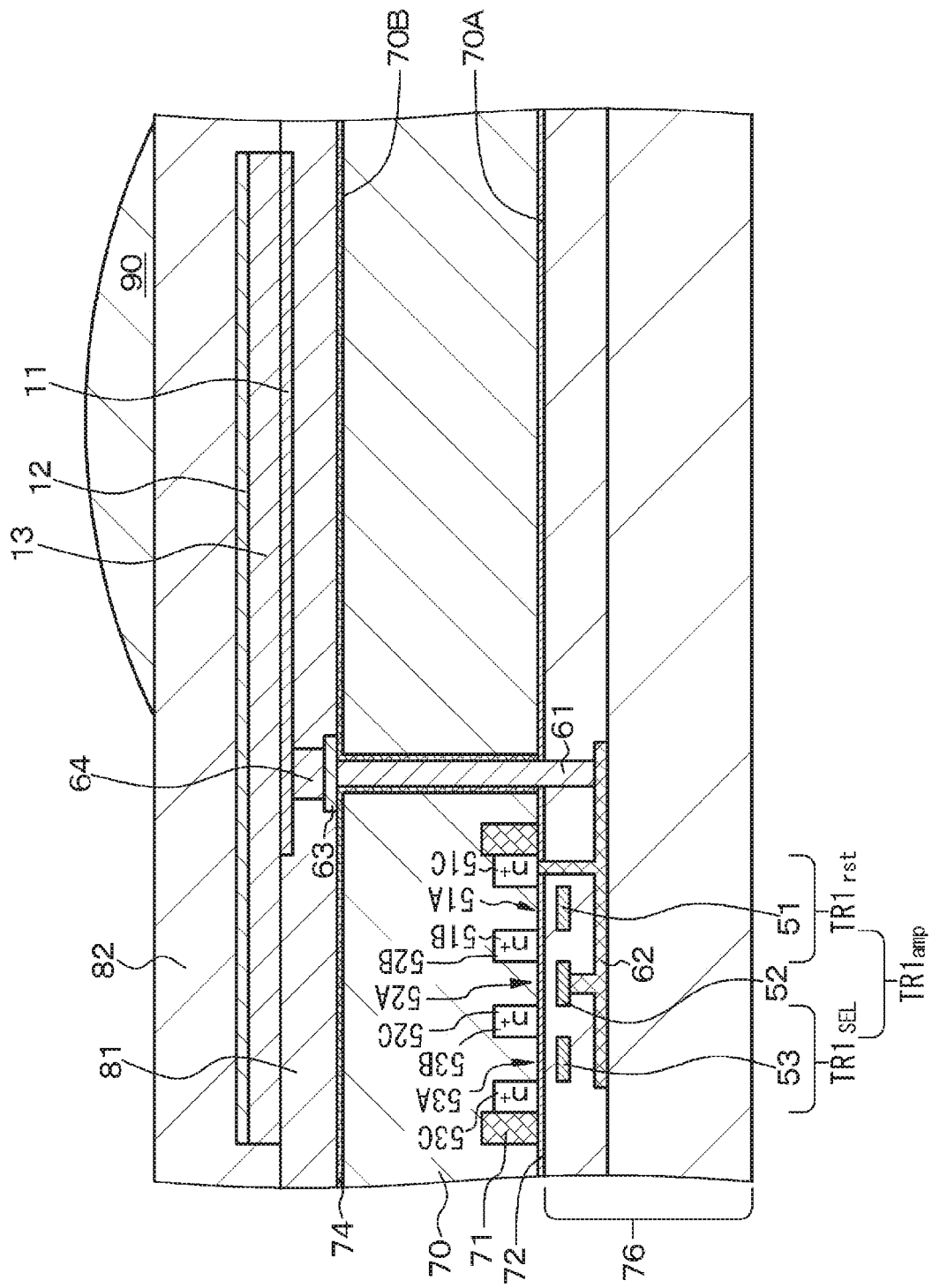
FIG. 12 is a schematic partial sectional view of another modified example of the imaging element of Embodiment 5.
Figure 13:
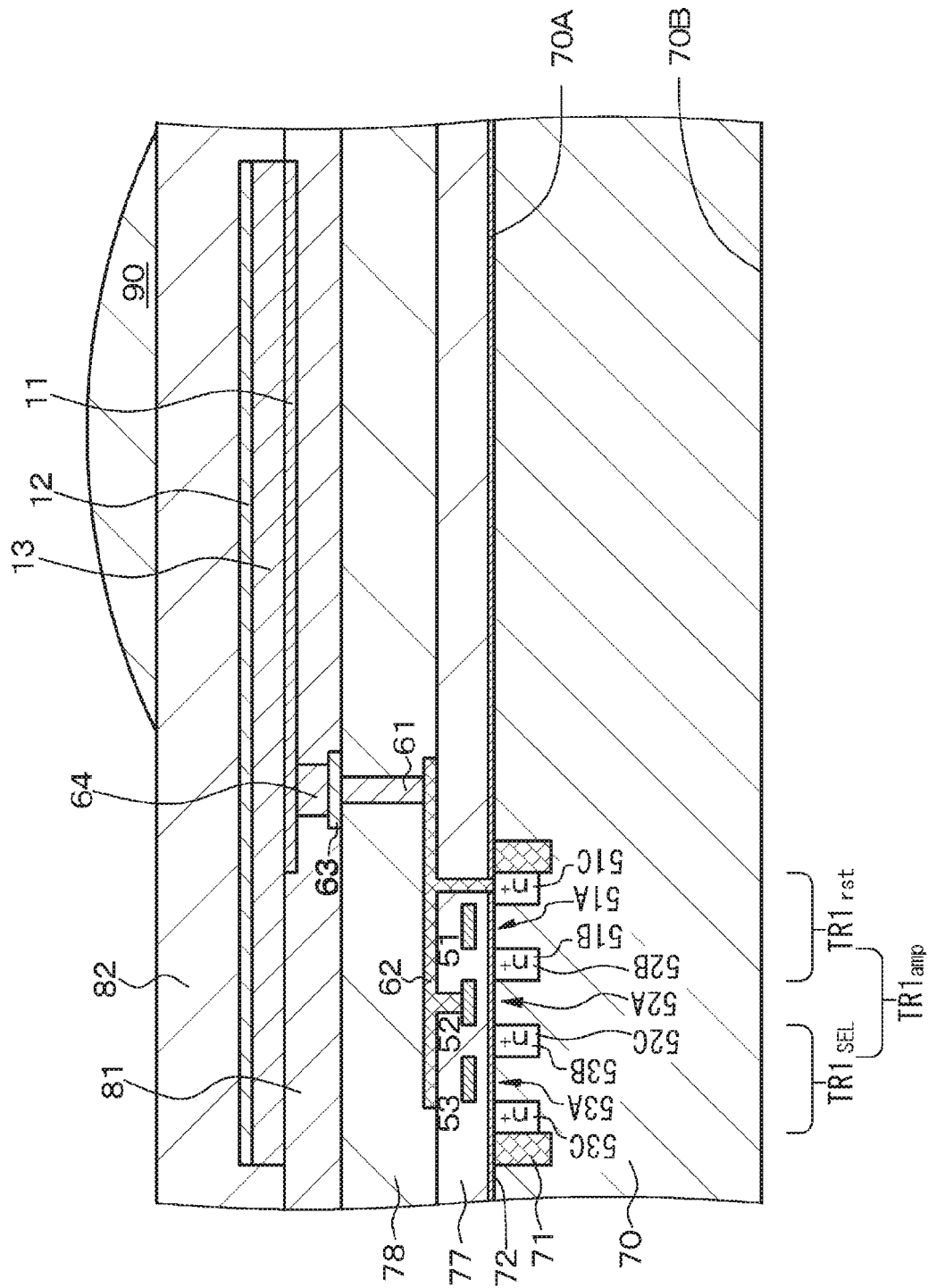
FIG. 13 is a schematic partial sectional view of another modified example of the imaging element of Embodiment 5.

A modified example of the imaging element of Embodiment 5 of which a schematic partial sectional view is shown in FIG. 12 is a back surface illuminated type imaging element, and is formed of the first imaging element of the first type of Embodiment 3. Furthermore, a modified example of the imaging element of Embodiment 5 of which a schematic partial sectional view is shown in FIG. 13 is a front surface illuminated type imaging element, and is formed of the first imaging element of the first type of Embodiment 3. Here, the first imaging element is formed of three types of imaging elements including an imaging element absorbing red light, an imaging element absorbing green light and an imaging element absorbing blue light. Moreover, the solid-state imaging apparatus according to the first aspect of the present disclosure is formed of a plurality of these imaging elements. An example of the arrangement of a plurality of the imaging elements includes a Bayer array. On-chip color filters for performing spectral division of blue, green, and red are provided as necessary at the light incident side of each imaging element.

Further, the form in which two first-type imaging element of Embodiment 3 are stacked (i.e., form in which two photoelectric conversion units are stacked and control units of two imaging elements are provided on semiconductor substrate), or, the form in which three first-type imaging element are stacked (i.e., form in which three photoelectric conversion units are stacked and control units of three imaging elements are provided on semiconductor substrate) may be adopted instead of providing one imaging first-type element. An example of a stacked structure of the first-type imaging element and the second-type imaging element is exemplified in the following table 3.

TABLE 3

| | First type | Second type | Reference drawing |
|---|---|---|---|
| Back surface illuminated type and front surface illuminated type | 1 Green | Blue + red | FIG. 2 FIG. 9 |
| | 1 Primary color | 1 Complementary color | FIG. 10 FIG. 11 |
| | 1 White | 1 Infrared ray | |
| | 1 Blue or green or red | 0 | FIG. 12 FIG. 13 |
| | 2 Green + infrared ligh | 2 Blue + red | |
| | 2 Green + blue | 1 Red | |
| | 2 White + infrared light | 0 | |
| | 3 Green + blue + red | 2 Blue-green (emerald color) + infrared light | |
| | 3 Green + blue + red | 1 Infrared light | |
| | 3 Green + blue + red | 0 | |

The present disclosure has been described above according to preferred embodiments, but is not limited to these embodiments. The structures, the configurations, the manufacturing conditions, the manufacturing methods, and the used materials of the imaging element, the photoelectric conversion element, the stacked-type imaging element, and the solid-state imaging apparatus described in the embodiments are exemplary and can be appropriately changed. Not only may one floating diffusion layer be provided in one imaging element, but one floating diffusion layer may also be provided in a plurality of imaging elements. That is, the plurality of imaging elements can share one floating diffusion layer by appropriately controlling a timing of a charge transfer period. Then, in this case, the plurality of imaging elements can also share one contact hole portion.

Figure 14:
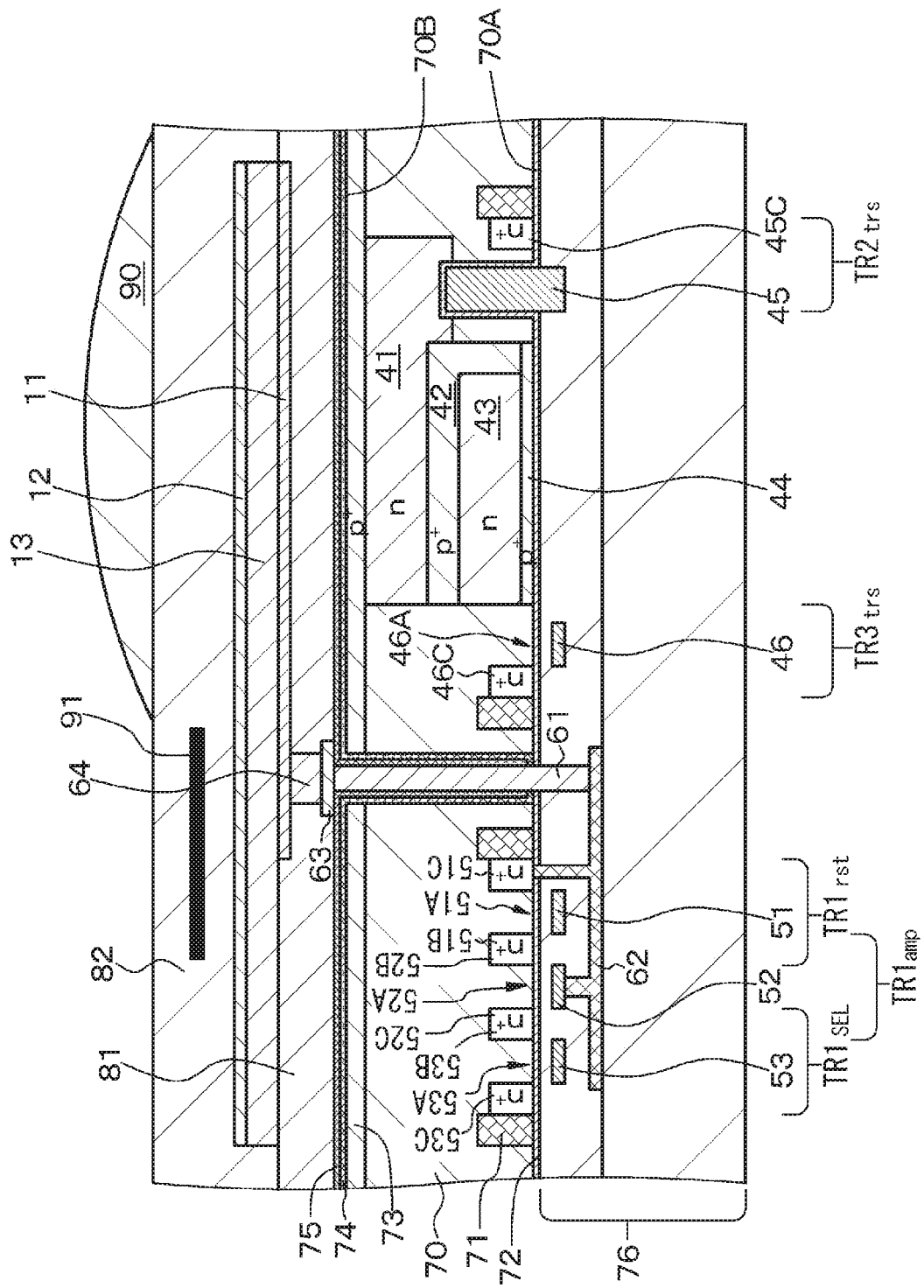
FIG. 14 is a schematic partial sectional view of a modified example of the imaging element and the stacked-type imaging element of Embodiment 3.

In addition, for example, as a modified example of the imaging element and the stacked-type imaging element described in Embodiment 3 illustrated in FIG. 14, a structure in which light is incident from the side of the second electrode 12 and a light shielding layer 91 is formed on a light incidence side in the second electrode 12 can be realized. Moreover, various wirings provided to be closer to the light incidence side than the photoelectric conversion layer can also be caused to function as a light shielding layer.

In the embodiments, electrons are assumed to be signal charges and a conductive type of the photoelectric conversion layer formed in the semiconductor substrate is set to the n type, but holes can also be applied to a solid-state imaging apparatus in which holes are assumed to be signal charges. In this case, each semiconductor region may be configured as a reverse conductive type of semiconductor region and a conductive type of photoelectric conversion layer formed in the semiconductor substrate may be set to the p type.

In addition, in the embodiments, the case of the application to the CMOS solid-state imaging apparatus in which unit pixels detecting a signal charge corresponding to an amount of incident light as a physical quantity are disposed in a matrix form has been described as an example, but the present disclosure is not limited to the application to the CMOS solid-state imaging apparatus and can also be applied to a CCD solid-state imaging apparatus. In the latter case, a pixel signal (image signal) is output by transferring the signal charge in the vertical direction by a vertical transfer register with a CCD structure, transferring the signal charge in the horizontal direction by the horizontal transfer register, and amplifying the signal charge. In addition, the present disclosure is not limited to a column type of general solid-state imaging apparatus in which pixels are formed in a 2-dimensional matrix form and a column signal processing circuit is disposed for each pixel column. Moreover, depending on a case, a select transistor can also be omitted.

Moreover, the imaging element and the stacked-type imaging element of the present disclosure is not limited to the application to the solid-state imaging apparatus that detects a distribution of an incidence light amount of the visible light and captures the distribution as an image, but may be applied to a solid-state imaging apparatus that captures a distribution of infrared light or an X ray or an incident amount of particles or the like as an image. In addition, the imaging element and the stacked-type imaging element can also be applied to a general solid-state imaging apparatus (physical quantity distribution detection apparatus) such as a fingerprint detection sensor that detects a distribution of another physical amount such as a pressure or an electrostatic capacity and captures the distribution as an image.

Moreover, the present disclosure is not limited to a solid-state imaging apparatus that sequentially scans unit pixels of an imaging region in units of rows and reads pixel signals from the unit pixels. The present disclosure can also be applied to an X-Y address type of solid-state imaging apparatus that selects any pixels in units of pixels and reads a pixel signal in the units of pixels from the selected pixels. The solid-state imaging apparatus may be formed as a one-chip or may be formed in a module shape with an imaging function realized by arranging and packaging an imaging region and a drive circuit or an optical system.

In addition, the present disclosure is not limited to the application to the solid-state imaging apparatus and can also be applied to an imaging apparatus. Here, the imaging apparatus refers to an electronic device that has an imaging function of a camera system such as a digital still camera or a video camera or a mobile phone or the like. A form with a module shape mounted on an electronic device, that is, a camera module, is used as an imaging apparatus in some cases.

Figure 15:
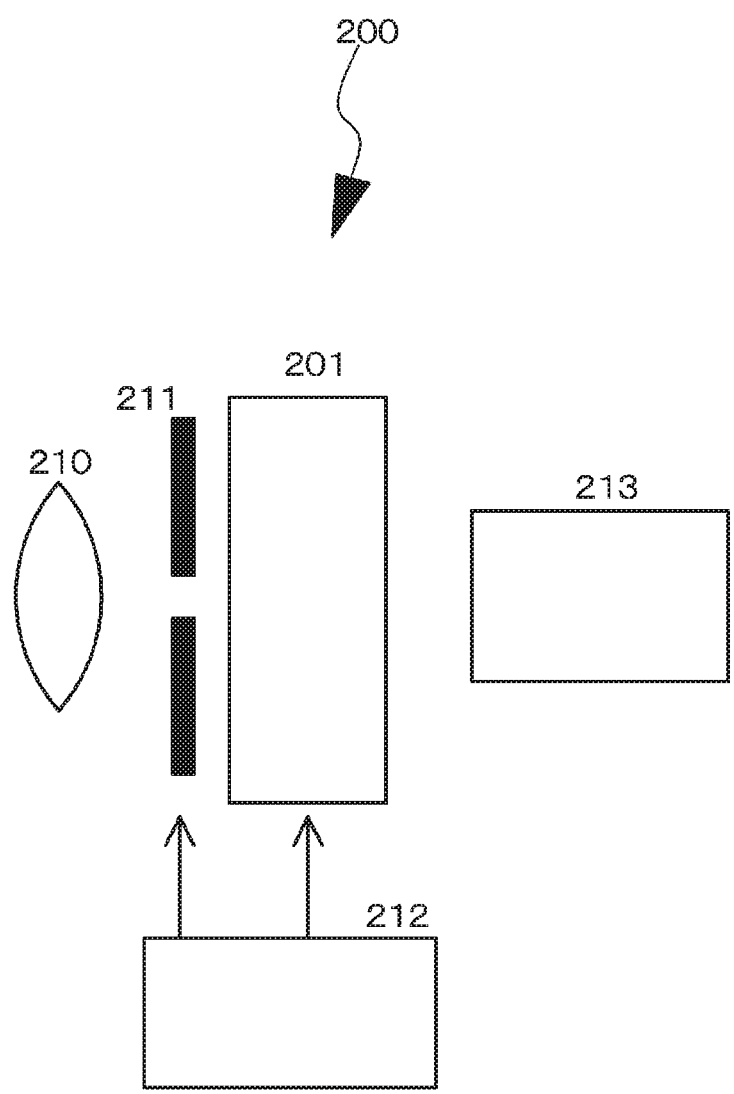
FIG. 15 is a conceptual diagram of an example in which a solid-state imaging apparatus formed of the imaging element and the stacked-type imaging element according to an embodiment of the present disclosure is used in an electronic device (camera).

FIG. 15 is a conceptual diagram of an example in which a solid-state imaging apparatus 201 formed of the imaging element and stacked-type imaging element of the present disclosure is used in an electronic device (camera) 200. The electronic device 200 includes the solid-state imaging apparatus 201, an optical lens 210, a shutter device 211, a drive circuit 212, and a signal processing circuit 213. The optical lens 210 forms an image light (incident light) from a subject as an image on an imaging surface of the solid-state imaging apparatus 201. Thus, signal charges are accumulated in the solid-state imaging apparatus 201 for a given period. The shutter device 211 controls a light irradiation period and a light shielding period for the solid-state imaging apparatus 201. The drive circuit 212 supplies a drive signal for controlling a transfer operation or the like of the solid-state imaging apparatus 201 and a shutter operation of the shutter device 211. A signal of the solid-state imaging apparatus 201 is transferred in accordance with the drive signal (timing signal) supplied from the drive circuit 212. The signal processing circuit 213 performs various kinds of signal processing. A video signal subjected to the signal processing is stored in a storage medium such as a memory or is output to a monitor. Since miniaturization of a pixel size in the solid-state imaging apparatus 201 and transfer efficiency are improved in the electronic device 200, the electronic device 200 in which an improvement in pixel characteristics is achieved can be obtained. The electronic device 200 to which the solid-state imaging apparatus 201 can be applied is not limited to a camera and can also be applied to an imaging apparatus such as a digital still camera or a camera module for a mobile device such as a mobile phone.

Additionally, the present technology may also be configured as below.

[A01] <<Imaging Element]

An imaging element having a stacked structure of a first electrode, an organic photoelectric conversion layer, and a second electrode, in which a first organic material layer and a second organic material layer are formed between the first electrode and the organic photoelectric conversion layer from the first electrode side.

[A02]

The imaging element according to [A01], in which the first organic material layer functions as a charge injection blocking layer.

[A03]

The imaging element according to [A02], in which the first organic material layer functions as a hole injection blocking layer.

[A04]

The imaging element according to any one of [A01] to [A03], in which the first organic material layer is formed of a material having a naphthalene diimide structure.

[A05]

The imaging element according to any one of [A01] to [A04], in which a LUMO value of a material forming the first organic material layer is deeper than −3.9 eV and a HOMO value of the material is deeper than −6.2 eV.

[A06]

The imaging element according to any one of [A01] to [A05], in which the second organic material layer functions as a base layer.

[A07]

The imaging element according to any one of [A01] to [A06], in which the second organic material layer is formed of a material having a pyridine end.

[A08]

The imaging element according to any one of [A01] to [A07], in which a glass transition temperature of a material forming the second organic material layer is 160° C. or higher.

[A09]

The imaging element according to any one of [A01] to [A08], in which a thickness of the second organic material layer is a value in the range of $1\times10^{-9}$ m to $5\times10^{-8}$ m.

[A10]

The imaging element according to any one of [A01] to [A09], in which the organic photoelectric conversion layer is formed of a material having a bulk heterostructure including a hole transport material and an electron transport material.

[B01] <<Photoelectric Conversion Element>>

A photoelectric conversion element having a stacked structure of a first electrode, an organic photoelectric conversion layer, and a second electrode, in which a first organic material layer and a second organic material layer are formed between the first electrode and the organic photoelectric conversion layer from the first electrode side.

[C01] <<Stacked-Type Imaging Element>>
A stacked-type imaging element formed by stacking at least one imaging element according to any one of [A01] to [A10].

[D01] <<Solid-State Imaging Apparatus: First Aspect>>
A solid-state imaging apparatus including:
a plurality of imaging elements according to any one of [A01] to [A10].

[D02] <<Solid-State Imaging Apparatus: Second Aspect>>
A solid-state imaging apparatus including:
a plurality of stacked-type imaging elements according to [A12].

REFERENCE SIGNS LIST 11 first electrode
12 second electrode
13 organic photoelectric conversion layer
14 first organic material layer (hole injection blocking layer)
15 second organic material layer
16 electron injection blocking layer
20 support substrate
41 n-type semiconductor region forming second imaging element
43 n-type semiconductor region forming third imaging element
42, 44, 73 p$^+$ layer
45 gate portion of transfer transistor
46 gate portion of transfer transistor
$FD_1$, $FD_{21}$, $FD_3$, 45C, 46C floating diffusion layer
$TR1_{amp}$ amplification transistor
$TR1_{rst}$ reset transistor
$TR1_{sel}$ select transistor
$TR2_{trs}$ transfer transistor
$TR2_{trs}$ reset transistor
$TR2_{amp}$ amplification transistor
$TR2_{sel}$ select transistor
$TR3_{trs}$ transfer transistor
$TR3_{rst}$ reset transistor
$TR3_{amp}$ amplification transistor
$TR3_{SEL}$ select transistor
$V_{DD}$ power supply
$RST_1$, $RST_2$, $RST_3$ reset line
$SEL_1$, $SEL_2$, $SEL_3$ select line
117, $VSL_1$, $VSL_2$, $VSL_3$ signal line
$TG_2$, $TG_3$ transfer gate line
$V_{OU}$ wiring
51 gate section of reset transistor $TR1_{rst}$
51A channel forming region of reset transistor $TR1_{rst}$
51B, 51C source/drain region of reset transistor $TR1_{rst}$
52 gate section of amplification transistor $TR1_{amp}$
52A channel forming region of amplification transistor $TR1_{amp}$
52B, 52C source/drain region of amplification transistor $TR1_{amp}$
53 gate section of select transistor $TR1_{sel}$
53A channel forming region of select transistor $TR1_{sel}$
53B, 53C source/drain region of select transistor $TR1_{sel}$
61 contact hole portion
62 wiring layer
63 pad portion
64 connection hole
70 semiconductor substrate
70A first surface (front surface) of semiconductor substrate
70B second surface (back surface) of semiconductor substrate
71 element separation region
72 oxide film
74 $HfO_2$ film
75 insulating film
76 interlayer insulating layer
77, 78, 81 interlayer insulating layer
82 protective layer
90 on-chip microlens
91 light shielding layer
100 solid-state imaging apparatus
101 stacked-type imaging element
111 imaging area
112 vertical drive circuit
113 column signal processing circuit
114 horizontal drive circuit
115 output circuit
116 drive control circuit
118 horizontal signal line
200 electronic device (camera)
201 solid-state imaging apparatus
210 optical lens
211 shutter device
212 drive circuit
213 signal processing circuit

The invention claimed is:
1. An imaging element, comprising:
a stacked structure of a first electrode, an organic photoelectric conversion layer, and a second electrode, wherein
the organic photoelectric conversion layer comprises a material that has a bulk heterostructure, and
the bulk heterostructure includes a hole transport material, an electron transport material, and an optical absorption organic semiconductor material;
a first organic material layer; and
a second organic material layer, wherein the first organic material layer and the second organic material layer between the first electrode and the organic photoelectric conversion layer from a side of the first electrode.

2. The imaging element according to claim 1, wherein the first organic material layer is a charge injection blocking layer.

3. The imaging element according to claim 2, wherein the first organic material layer is a hole injection blocking layer.

4. The imaging element according to claim 1, wherein the first organic material layer includes a material that has a naphthalene diimide structure.

5. The imaging element according to claim 1, wherein the first organic material layer includes a material that has a LUMO value deeper than −3.9 eV and a HOMO value deeper than −6.2 eV.

6. The imaging element according to claim 1, wherein the second organic material layer is a diffusion prevention layer.

7. The imaging element according to claim 1, wherein the second organic material layer includes a material that has a pyridine end.

8. The imaging element according to claim 1, wherein the second organic material layer includes a material that has a glass transition temperature of at least 160° C.

9. The imaging element according to claim 1, wherein a thickness of the second organic material layer is a value in a range of $1 \times 10^{-9}$ m to $5 \times 10^{-8}$ m.

10. The imaging element according to claim 1, wherein at a maximum light absorption wavelength in visible light range, a first ray absorption coefficient value of the optical absorption organic semiconductor material is greater than each of a second ray absorption coefficient value of the hole transport material and a third ray absorption coefficient value of the electron transport material.

11. The imaging element according to claim 1, wherein the optical absorption organic semiconductor material includes subphthalocyanine.

12. A photoelectric conversion element, comprising:
a stacked structure of a first electrode, an organic photoelectric conversion layer, and a second electrode, wherein
the organic photoelectric conversion layer comprises a material that has a bulk heterostructure, and
the bulk heterostructure includes a hole transport material, an electron transport material, and an optical absorption organic semiconductor material;
a first organic material layer; and
a second organic material layer, wherein the first organic material layer and the second organic material layer between the first electrode and the organic photoelectric conversion layer from a side of the first electrode.

13. A stacked-type imaging element, comprising:
at least one imaging element of a plurality of imaging elements, wherein the at least one imaging element comprises:
a stacked structure of a first electrode, an organic photoelectric conversion layer, and a second electrode, wherein
the organic photoelectric conversion layer comprises a material that has a bulk heterostructure, and
the bulk heterostructure includes a hole transport material, an electron transport material, and an optical absorption organic semiconductor material;
a first organic material layer; and
a second organic material layer, wherein the first organic material layer and the second organic material layer are between the first electrode and the organic photoelectric conversion layer from a side of the first electrode.

14. A solid-state imaging apparatus, comprising:
a plurality of imaging elements, wherein each imaging element of the plurality of imaging elements comprises:
a stacked structure of a first electrode, an organic photoelectric conversion layer, and a second electrode, wherein
the organic photoelectric conversion layer comprises a material that has a bulk heterostructure, and
the bulk heterostructure includes a hole transport material, an electron transport material, and an optical absorption organic semiconductor material;
a first organic material layer; and
a second organic material layer, wherein the first organic material layer and the second organic material layer are between the first electrode and the organic photoelectric conversion layer from a side of the first electrode.

15. A solid-state imaging apparatus, comprising:
a plurality of stacked-type imaging elements, wherein each stacked-type imaging element of the plurality of stacked-type imaging elements comprises:
a stacked structure of at least one imaging element of a plurality of imaging elements, wherein the at least one imaging element comprises:
a stacked structure of a first electrode, an organic photoelectric conversion layer, and a second electrode, wherein
the organic photoelectric conversion layer comprises a material that has a bulk heterostructure, and
the bulk heterostructure includes a hole transport material, an electron transport material, and an optical absorption organic semiconductor material;
a first organic material layer; and
a second organic material layer, wherein the first organic material layer and the second organic material layer are between the first electrode and the organic photoelectric conversion layer from a side of the first electrode.

* * * * *